(12) United States Patent
Takata et al.

(10) Patent No.: US 6,522,581 B2
(45) Date of Patent: Feb. 18, 2003

(54) SEMICONDUCTOR STORAGE DEVICE

(75) Inventors: Hidekazu Takata, Nara (JP);
Haruyasu Fukui, Yoshino-gun (JP);
Ken Sumitani, Tenri (JP)

(73) Assignee: Sharp Kabushiki Kaisha (JP)

( * ) Notice: Subject to any disclaimer, the term of this patent is extended or adjusted under 35 U.S.C. 154(b) by 0 days.

(21) Appl. No.: 09/881,315

(22) Filed: Jun. 12, 2001

(65) Prior Publication Data

US 2001/0053090 A1 Dec. 20, 2001

(30) Foreign Application Priority Data

Jun. 12, 2000 (JP) ....................................... 2000-176182

(51) Int. Cl.$^7$ .............................................. G11C 16/04
(52) U.S. Cl. .................. 365/185.05; 365/181; 365/185; 365/226
(58) Field of Search ................................. 365/181, 185, 365/185.05, 190, 203, 226, 230.03, 230.05, 230.06

(56) References Cited

U.S. PATENT DOCUMENTS

| | | | | |
|---|---|---|---|---|
| 4,685,085 A | * | 8/1987 | Spence ................... | 365/185.08 |
| 4,706,220 A | * | 11/1987 | Spence ....................... | 365/154 |
| 4,953,127 A | * | 8/1990 | Nagahashi et al. .... | 365/189.05 |
| 5,343,437 A | * | 8/1994 | Johnson et al. .......... | 365/185.3 |
| 5,422,856 A | * | 6/1995 | Sasaki et al. ........... | 365/189.05 |
| 5,509,134 A | | 4/1996 | Fandrich et al. | |

FOREIGN PATENT DOCUMENTS

| | | |
|---|---|---|
| EP | 0 398 067 A2 A3 | 11/1990 |
| EP | 0 406 996 A1 | 1/1991 |
| JP | 10-144086 | 5/1998 |
| JP | 10-283768 | 10/1998 |
| JP | 11-085609 | 3/1999 |

OTHER PUBLICATIONS esp@cenet Database English Abstract of Japanese Application 10–144086 (May 29, 1998).

* cited by examiner

Primary Examiner—David Nelms
Assistant Examiner—Dao H. Nguyen
(74) Attorney, Agent, or Firm—Morrison & Foerster LLP

(57) ABSTRACT

A semiconductor storage device includes: a plurality of first memory arrays each including a plurality of semiconductor storage elements, in which data from an external device is written, and from which the data is read out to the external device, a second memory array which operates separately from the plurality of first memory arrays and which includes at least one block including a plurality of non-volatile semiconductor storage elements; and a data transfer section for transferring the data between the plurality of first memory arrays and the second memory array.

38 Claims, 26 Drawing Sheets

Memory to be accessed is distinguishable by CE# signal and address

Writing of data from external device into SRAM0

Writing of data into SRAM0 based on command

Issuance of transfer command for
transferring particular data from SRAM0 to flash memory Issuance of transfer command for transferring data en bloc from SRAM0 to flash memory Issuance of transfer command for
transferring particular data from flash memory to SRAM0

Issuance of transfer command for transferring data
en bloc from flash memory to SRAM0

SEMICONDUCTOR STORAGE DEVICE

CROSS-REFERENCE TO RELATED APPLICATIONS

This application claims priority to Japanese Patent Application Number 2000-176182 filed Jun. 12, 2000, the content of which is incorporated herein by reference in its entirety.

BACKGROUND OF THE INVENTION

1. Field of the Invention

The present invention relates to a semiconductor storage device.

2. Description of the Related Art

A non-volatile memory is characterized in that data stored in that memory is not deleted even after the power thereto is turned off. In this point, the nonvolatile memory is different from a volatile memory such as a Dynamic Random Access Memory (DRAM), a Static Random Access Memory (SRAM), or the like, from which data is deleted when the power thereto is turned off. Examples of the non-volatile memory include a flash memory (EEPROM) which is used for various applications such as portable phones, etc., a ferroelectric memory (FRAM) which is used in an IC card, etc., a magnetic memory (MRAM) which has been actively developed, and the like.

FIG. 1 schematically shows a structure of a flash memory cell for used in a non-volatile semiconductor storage device. A flash memory cell 10 shown in FIG. 1 has a control gate 2, a floating gate 3, a source 4, and a drain 5. Data, "1" or "0", is stored in this flash memory cell 10 according to the quantity of electrons infected in the floating gate 3. A plurality of such flash memory cells 10 are arranged into a plurality of matrix blocks each formed by mxn cells 10, and the matrix blocks are connected to one another, whereby a flash memory array (nonvolatile semiconductor storage device) is formed.

FIG. 2 shows a structure of an NOR-type flash memory, and especially, shows a relationship between an X-decoder and word lines. As shown in FIG. 2, the NOR-type flash memory includes a pair of matrix blocks BLK1 and BLK2 formed by a plurality of flash memory cells 10. In each matrix block, control gates 2 of n flash memory cells 10 in a row are connected to a corresponding one of m word lines WL1 to WLm, and drains 5 of m flash memory cells 10 in a column are connected to a corresponding one of n bit lines BL1 to BLn. In the blocks BLK1 and BLK2, all of the sources 4 of the flash memory cells 10 are connected to a single common source line S.

As shown in FIG. 2, in each block of the flash Memory array, sources 4 of the flash memory cells 10 are commonly connected to the single source line S. In such a structure, data stared in the flash memory calls 10 in one block is deleted all together and cannot be deleted from each of the flash memory cells 10, i.e., cannot be deleted on a bit-by-bit basis.

Reading, writing, and deleting of date In the flash memory array shown in FIG. 2 is now briefly described. When data stored in some of the flash memory cells 10 is read out, read signals including a control signal, an address signal, etc., are supplied from a central processing unit (CPU: not shown), or the like, externally connected to the flash memory array so that a high voltage of, for example, 5 V is applied to a control gate 2 of the flash memory cell 10, a low voltage of, for example, 1 V is applied to a drain 5 of the flash memory cell 10, and a low voltage of, for example, 0 V is applied to a source 4 of the flash memory cell 10. At this time, the magnitude of a current which flows between the source 4 and the drain 5 is sensed by a sense amplifier (not shown), thereby determining whether data is "1" or "0". Then, the data read from the flash memory cell 10 is output outside of the flash memory, whereby a data reading operation is completed.

Writing of data in the flash memory array is performed as follows. When a control signal, an address signal, and data are supplied from a CPU or the like, which is externally connected to the flash memory array, are supplied to the flash memory array, in some of the flash memory cells 10 which is designated by the address signal, a high voltage of, for example, 12 V is applied to the control gate 2, a high voltage of, for example, 7 V is applied to the drain 5, and a low voltage of, for example, 0 V is applied to the source 4. By applying such voltages, hot electrons are generated in the vicinity of the junction of the drain 5, and the generated hot electrons are injected into the floating gate 3 due to the high voltage applied to the control gate 2. Thereafter, such a writable state is ended, and a verification operation is performed. After the writing of data in the flash memory cell 10 has been completed, if the verification operation is successful, the writing operation is completed. If the verification operation is unsuccessful, writing of the data, and the verification operation, are performed again. If the verification operation is unsuccessful again, writing of the data, and the verification operation, are further performed a predetermined number of times. If the verification operation is still unsuccessful, the CPU or the like recognizes it as a write error.

Lastly, an erasing operation of the flash memory array is described. Data in the flash memory array is erased on a block by block basis. A control signal, a block address, and a deletion command are supplied from the CPU or the like to the flash memory array so that a low voltage of, for example, −10 V is applied to the control gate 2, the drain 5 is floated, and a high voltage of, for example, 6 V is applied to the source 4. With application of such voltages, a high electric field is generated between the floating gate 3 and the source 4, and electrons in the control gate 2 can be taken out therefrom by means of tunneling, whereby the data is deleted.

Thereafter, such a data erasable state is ended, and a verification operation is performed similarly to that for the writing of data. If the verification operation is successful for all of the flash memory cells 10 in the block to which the deletion command is supplied, the data deletion operation is completed. If the verification is unsuccessful, deletion of the data, and the verification operation, are performed again. If the verification operation is still unsuccessful after deletion of the data, and the verification operation, has been performed a predetermined number of times, the CPU or the like recognizes it as an erase error.

In a typical flash memory array, an erase operation including a verification operation requires a longer time than a program operation including a verification operation, and a program operation including a verification operation requires a longer time than a read operation. Specifically, the read operation requires about 100 ns, the program operation including the verification operation requires about 30 $\mu$s, and the erase operation including the verification operation requires about 500 mm. Thus, in the flash memory array, a considerably longer time is required for writing and erasing of data as compared with reading of data. It should be noted that, in this specification, a "program operation" in a nonvolatile memory (e.g., flash memory) means writing of data in the non-volatile memory.

On the other hand, a volatile semiconductor storage device, such as a DRAM, an SRAM, etc., loses data stored therein when the power to the storage device is turned off. However, the time required for writing data in the storage device is substantially the same as that required for reading the data therefrom. For example, in an SRAM, only about 100 ns is required for completing each of a write operation and a read operation. Thus, in the SRAM, replacing of data can be completed in a considerably shorter time as compared with the time required for erasing and writing of data in the flash memory array.

FIG. 3 shows a typical memory cell of a SRAM. An SRAM memory cell 6 shown in FIG. 3 is formed by a pair of switch transistors 7 and a pair of inverters 8. Reading of data from the SRAM memory cell 6 is now described. In a read operation in the SRAM memory cell 6, in the first step, a pulse voltage is applied to a word line WL which is selected by an address signal, whereby any of the switch transistors 7 is turned on. At this time, a voltage at a BIT terminal and a voltage at a BIT# terminal are compared by a sense amplifier, thereby determining whether the data stored in the SRAM memory cell 6 is "1" or "0". Then, the data read from the SRAM memory cell 6 is output to an external CPU or the like, whereby the read operation is completed.

When writing data in the SRAM memory cell 6, as in the read operation, a pulse voltage is applied to a word line WL which is selected by an address signal, whereby any of the switch transistors 7 is turned on. At this time, a high voltage is applied to one of the BIT terminal and the BIT# terminal, and a low voltage is applied to the other, whereby voltages are respectively applied to nodes N1 and N2, and binary data ("1" or "0") is written by means of combinations of the voltages.

In a flash memory, when the CPU, which is externally connected to the flash memory, processes data, since a program operation requires a longer time, a standby time of the CPU during the program operation becomes longer. In the case of writing a large amount of data, the CPU cannot execute other operations during the program operation.

In some applications of a semiconductor storage device, data is temporarily stored in a volatile semiconductor storage device which requires a short time for a write operation, such as an SRAM, which is called a "page buffer", and then, the data is transferred to the flash memory en bloc. With such an arrangement, the time required for writing data is reduced in appearance. In such a semiconductor storage device, the CPU does not need to execute writing of data in the flash memory and therefore can secure times for other operations.

Japanese Laid-Open Publication No. 11-85609 discloses a semiconductor storage device which uses a page buffer technique where an overhead which is caused when data is transferred to a flash memory is reduced, whereby a decrease in data transfer rate is suppressed. Japanese Laid-Open Publication No. 10-283768 discloses a semiconductor storage device which uses a page buffer technique where the rate of a data write access can be increased.

Thus, in a flash memory which requires a long time for a program operation, when an external CPU processes data, a standby time of the CPU during the program operation becomes longer. Especially in the case of writing a large amount of data, the CPU cannot execute other operations for a long time during the program operation. In a conventional technique for writing data by using a pager buffer, data is temporarily stored in the page buffer, and the data is then transferred from the page buffer to a flash memory en block.

With such an arrangement, the standby time of the CPU during writing of data in the flash memory is eliminated, the time required for writing data in the flash memory is reduced in appearance.

However during the transfer of data from the page buffer to the flash memory, subsequent data cannot be written in the page buffer, or the data cannot be read from the page buffer. Therefore, the page buffer cannot be used for temporarily storing other data.

In order to solve such a problem, in some applications, an SRAM is externally provided for temporarily storing data. However, in such a case, when a larger amount of data is required to be written at a high rate, the capacity of the externally-provided SRAM which is required for temporarily storing the data is increased.

Furthermore, when data in the flash memory is replaced with another, deletion of data and writing of data cannot be executed at the same time. Thus, after data in a block is erased, data is written in the cleared block on a memory cell by memory cell basis. Such a process requires a relatively long process time.

Furthermore, the above-described storage device which has the page buffer does not have a function for transferring data stored in the flash memory to the page buffer.

SUMMARY OF THE INVENTION

According to one aspect of the present invention, a semiconductor storage device includes: a plurality of first memory arrays each including a plurality of semiconductor storage elements, in which data from an external device is written, and from which the data is read out to the external device; a second memory array which operates separately from the plurality of first memory arrays and which includes at least one block including a plurality of non-volatile semiconductor storage elements; and a data transfer section for transferring the data between the plurality of first memory arrays and the second memory array.

In one embodiment of the present invention, the plurality of first memory arrays, the second memory array, and the data transfer section are formed on a same chip.

In another embodiment of the present invention, the plurality of semiconductor storage elements included in the first memory array are non-volatile semiconductor storage elements.

In still another embodiment of the present invention, the plurality of semiconductor storage elements included in the first memory array are volatile semiconductor storage elements.

In still another embodiment of the present invention, during a transfer of the data between at least one of the plurality of first memory arrays and the second memory array, an external device externally attached to the semiconductor storage device reads first data from or writes first data in the plurality of first memory arrays.

In still another embodiment of the present invention, during a transfer of the data between at least one of the plurality of first memory arrays and the second memory array, an external device externally attached to the semiconductor storage device reads first data from, writes first data in, or erases first data from the second memory array.

In still another embodiment of the present invention, a command to access the second memory array includes a command to access the plurality of first memory arrays.

In still another embodiment of the present invention, the data transfer section transfers the data stored in a first address in the plurality of first memory arrays to a second address in the second memory array.

In still another embodiment of the present invention, the data transfer section transfers the data stored in a second address in the second memory array to a first address in the plurality of first memory arrays.

In still another embodiment of the present invention, the data transfer section transfers the data stored in a first region in the plurality of first memory arrays to a second region in the second memory array.

In still another embodiment of the present invention, the data transfer section transfers the data stored in a second region in the second memory array to a first region in the plurality of first memory arrays.

In still another embodiment of the present invention, the data transfer section transfers all of the data stored in at least one of the plurality of first memory arrays to a particular region in the second memory array.

In still another embodiment of the present invention, the data transfer section transfers an amount of the data which is equal to the capacity of at least one of the plurality of first memory arrays to the at least one of the plurality of first memory arrays from the second memory array.

In still another embodiment of the present invention, before a transfer of the data between the plurality of first memory arrays and the second memory array, the data transfer section compares the data stored in a transfer origin address and first data stored in a transfer destination address; when the data stored in the transfer origin address is identical to the first data stored in the transfer destination address, the data transfer section does not transfer the data; and when otherwise, the data transfer section transfers the data from the transfer origin address to the transfer destination address.

In still another embodiment of the present invention, the external device accesses the plurality of first memory arrays except for the at least one of the plurality of first memory arrays during the transfer of the data between the at least one of the plurality of first memory arrays and the second memory array.

In still another embodiment of the present invention, an access by the external device to the at least one of the plurality of first memory arrays is prohibited during the transfer of the data between the at least one of the plurality of first memory arrays and the second memory array.

In still another embodiment of the present invention, a transfer of the data between the at least one of the plurality of first memory arrays and the Second memory array is interrupted by an access by the external device and the transfer of the data between the at least one of the plurality of first memory arrays and the second memory array is resumed after the access by the external device has been completed.

In still another embodiment of the present invention, while the data at being erased from a particular block in the second memory array, the plurality of first memory arrays are accessed by the external device.

In still another embodiment of the present invention, while the data is being written in a particular block in the second memory array, the plurality of first memory arrays are accessed by the external device.

In still another embodiment of the present invention, a capacity of the at least one of the plurality of the first memory arrays is equal to, multiple of, or divisional of a capacity of a block in the second memory array which can be erased en bloc.

In still another embodiment of the present invention, the plurality of first memory arrays and the second memory array exist in different memory spaces; and an access to the plurality of first memory arrays and an access to the second memory array are achieved by a single control terminal.

In still another embodiment of the present invention, the plurality of first memory arrays and the second memory array exist in a same memory space; and an access to the plurality of first memory arrays and an access to the second memory array are achieved by different control terminals.

In still another embodiment of the present invention, an access mode is switched between a first access mode where an access to the plurality of first memory arrays and an access to the second memory array are achieved by a single control terminal and a second access mode where the access to the plurality of first memory arrays and the access to the second memory array are achieved by two or more control terminals.

In still another embodiment of the present invention, the second memory array includes a plurality of banks, in each of which an erase operation and a program operation of the data and a read operation of the data can be executed separately from other banks; and the data is transferred between the plurality of banks and the plurality of first memory arrays through the data transfer section.

In still another embodiment of the present invention, during a transfer of the data between the plurality of banks and the plurality of first memory arrays, the external device executes one of reading of first data from the plurality of first memory arrays, writing of second data in the plurality of first memory arrays, and reading of third data from at least one of the plurality of banks which is not used for the transfer of the data.

In still another embodiment of the present invention, while the data is being erased from one of the plurality of banks, the external device executes one of reading of first data from the plurality of first memory arrays, writing of second data in the plurality of first memory arrays, and reading of third data from at least one of the plurality of banks in which the erasure of the data is not executed.

In still another embodiment of the present invention, while the data is being written in one of the plurality of banks, the external device executes one of reading of first data from the plurality of first memory arrays, writing of second data in the plurality of first memory arrays, and reading of third data from at least one of the plurality of banks in which the writing of the data is not executed.

In still another embodiment of the present invention, all of the data written in at least one of the plurality of first memory arrays is reset to a predetermined state.

In still another embodiment of the present invention, the at least one of the plurality of first memory arrays is reset to a value of a reset cell of the second memory array.

In still another embodiment of the present invention, after the data written in at least one of the plurality of first memory arrays is transferred to the second memory array, the at least one of the plurality of first memory arrays is reset.

In still another embodiment of the present invention, the data in at least one of the plurality of first memory arrays is protected from an overwrite.

In still another embodiment of the present invention, the data transfer section transfers the data in a first region in the second memory array to a second region in the plurality of first memory arrays when a power to the semiconductor storage device is turned on or when the semiconductor storage device returns from a power-down state to a normal active State.

In still another embodiment of the present invention, after the data is transferred from the second memory array to the plurality of first memory arrays, the transferred data in the plurality of first memory arrays are protected from an overwrite.

In still another embodiment of the present invention, an access by the external device to the plurality of first memory arrays and an access by the external device to the second memory array are performed in synchronization with a clock signal.

In still another embodiment of the present invention, a transfer status of the data between the plurality of first memory arrays and the second memory array is output to the external device.

In still another embodiment of the present invention, the semiconductor storage device further includes an input/output data bus which has a predetermined bus width, wherein allocation of bus width to the plurality of first memory arrays and the second memory array is switched between a case where one of at least one of the plurality of first memory arrays and the second memory array uses the input/output data bus and a case where both of at least one of the plurality of first memory arrays and the second memory array use the input/output data bus.

In still another embodiment of the present invention, the allocation of the bus widths to the plurality of first memory arrays and the second memory array is controlled by one of a control terminal connected to the external device and a predetermined command.

In still another embodiment of the present invention, the semiconductor storage device further includes; an input/output data bus which is used for a transfer of the data between the external device and the plurality of first memory arrays and the second memory array; and an internal data bus which is used for a transfer of the data between the plurality of first memory arrays and the second memory array, wherein a bus width of the internal data bus is greater than that of the input/output data bus.

Thus, the invention described herein makes possible the advantages of providing a semiconductor storage device which can eliminate the standby time of a device externally connected to the storage device, such as a CPU or the like, during writing of data, and which does not require an externally-provided SRAM, whereby a chip area can be reduced.

These and other advantages of the present invention will become apparent to those stilled in the art upon reading and understanding the following detailed description with reference to the accompanying figures.

DESCRIPTION OF THE PREFERRED EMBODIMENTS

Figure 1:
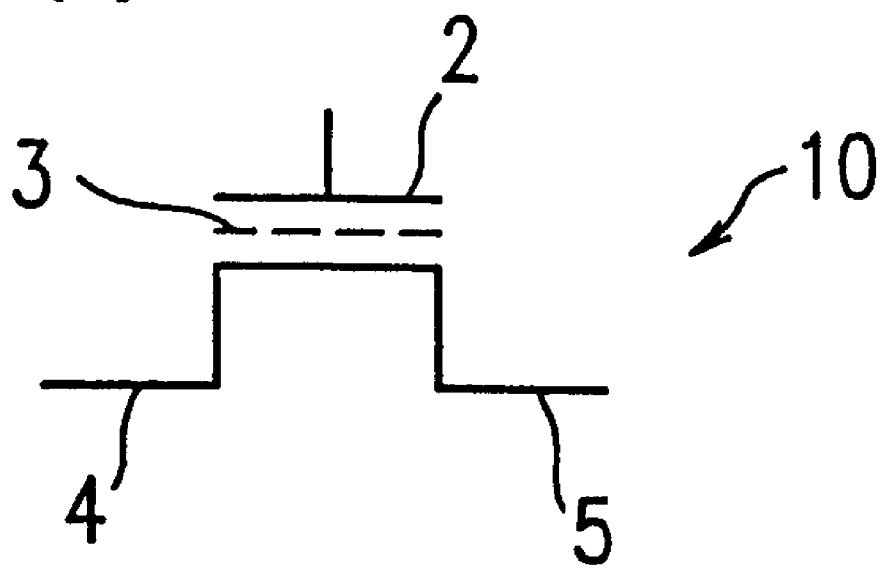
FIG. 1 is a schematic circuit diagram showing a structure of a memory cell of a flash memory which is a non-volatile semiconductor storage device.
Figure 2:
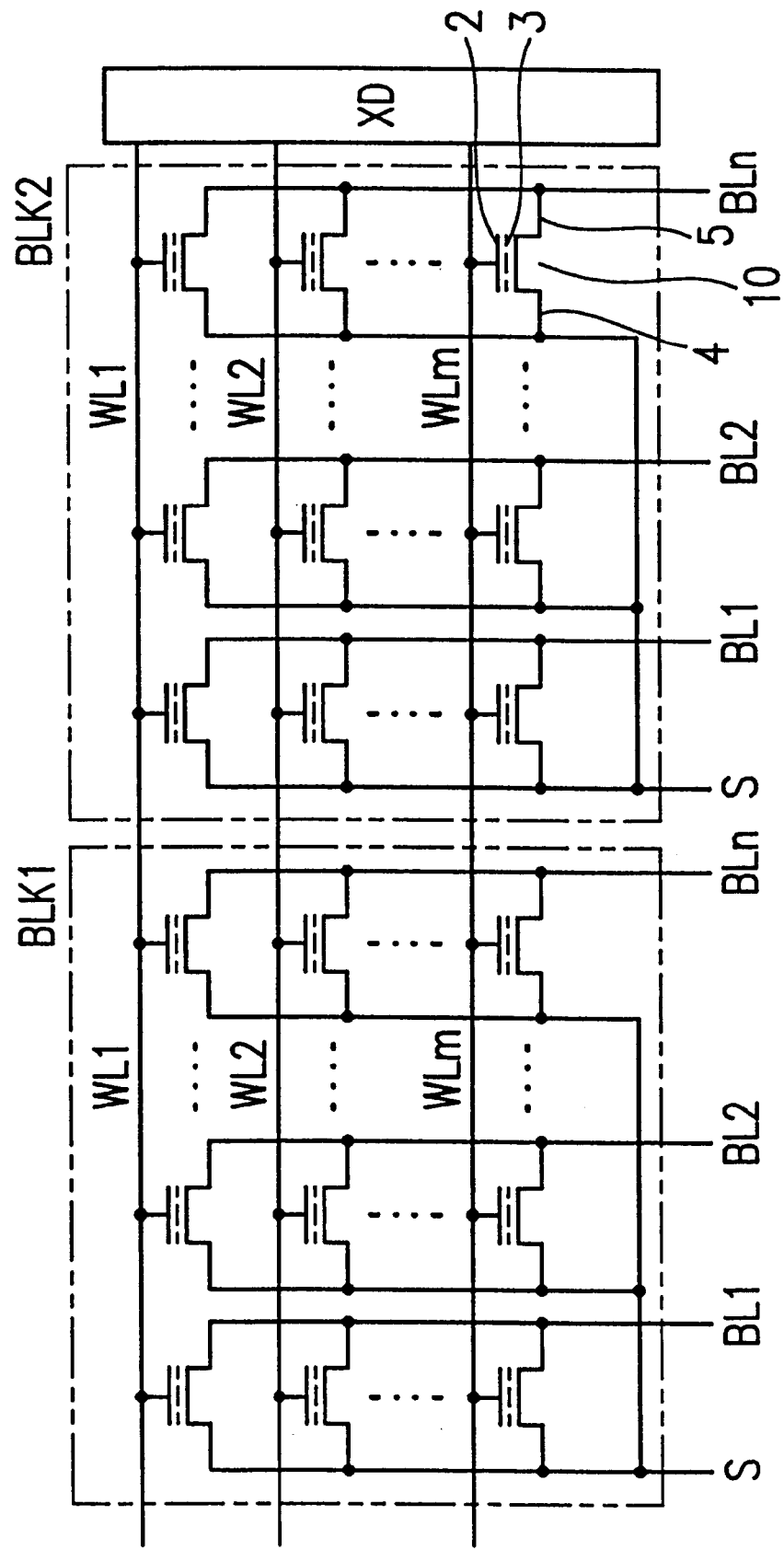
FIG. 2 is a schematic circuit diagram showing a block structure of a NOR-type flash memory, especially showing a relationship between an X-decoder and word lines.

Hereinafter, embodiments of the present invention will be described with reference to the drawings. Through the drawings, like reference numerals denote like elements.

Embodiment 1

Figure 4:
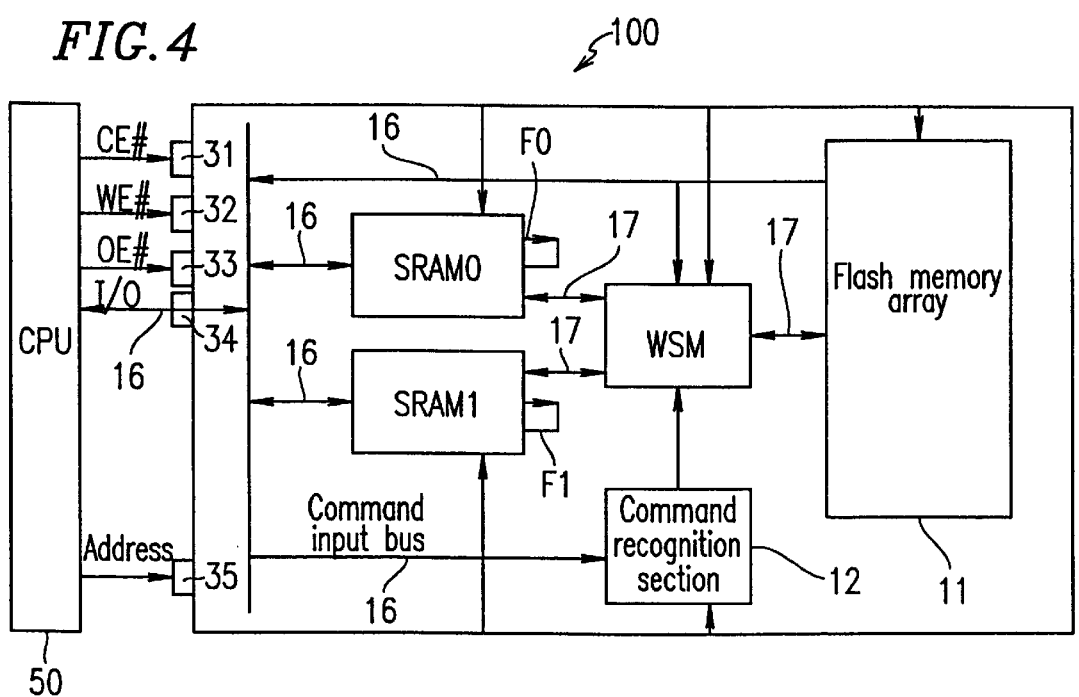
FIG. 4 shows a structure of a semiconductor storage device 100 according to embodiment 1 of the present invention.

FIG. 4 shows a structure of a semiconductor storage device 100 according to embodiment 1 of the present invention.

The semiconductor storage device 100 shown in FIG. 4 includes: SRAM0 and SRAM1 which are separate volatile semiconductor storage devices formed by SRAM arrays, in each of which data can be read and written; a flash memory array 11 formed by a flash memory which is a non-volatile semiconductor storage device; a write state machine WSM for transferring data between the flash memory array 11 and SRAM0 and SRAM1 and a command recognition section 12 for recognizing a command from an external central processing unit (external CPU) 50 externally connected to the semiconductor storage device 100. SRAM0 and SRAM1 and the flash memory array 11 are formed on a same chip.

During a data transfer between the flash memory array 11 and SRAM0 and SRAM1, the write state machine WSM controls: reading of data from SRAM0 and SRAM1; writing of data in SRAM0 and SRAM1; reading of data from the flash memory array 11; writing of data in the flash memory array 11; writing and erasing of data in the flash memory array 11 and SRAM0 and SRAM1 based on an operation command from the external CPU 50, etc. The command recognition section 12 recognizes a command from the external CPU 50, e.g., a command for SRAM0 and SRAM1 to respectively output flags P1 and F2 which indicate the status of data transfer.

The data transfer between the semiconductor storage device 100 and the external CPU 50 is achieved through an input/output data bus 16 connected to an I/O (input/output) pin 34. The data transfer between the write state machine WSM and each of SRAM0 and SRAM1, the data transfer between the write state machine WBM and the flash memory array 11; and the transfer of a command are achieved through internal transfer data buses 17.

A read operation and a write operation in SRAM0 are executed separately from those executed in SRAM1; and naturally, a read operation and a write operation in SRAM1 are executed separately from those executed in SRAM0. An access by the external CPU to SRAM0 or SRAM1 is made based on a combinatorial logic of a chip enable signal CE# input from a CE# pin 31 and an address input concurrently with the chip enable signal CE#. Furthermore, when data is transferred to SRAM0 or SRAM1, writing and reading of data are controlled by an internal control circuit (not shown).

In the semiconductor storage device 100 according to embodiment 1, a pair of SRAM arrays (SRAM0 and SRAM1), which are used separately from each other, are provided. However, a semiconductor storage device of the present invention may include three or more SRAM arrays. In such a case, data can be flexibly stored in each SRAM array. Furthermore, although a flash memory (EEPROM) array is used as the memory array 11 formed by a non-volatile semiconductor storage device in embodiment 1, a memory array formed by other types of non-volatile semiconductor storage devices, such as an EPROM, may be used. Moreover, although SRAM arrays (SRAM0 and SRAM1) are used an the memory arrays formed by volatile semiconductor storage devices in embodiment 1, a memory array formed by other types of volatile semiconductor storage devices, such as a DRAM, may be used.

Figure 5:
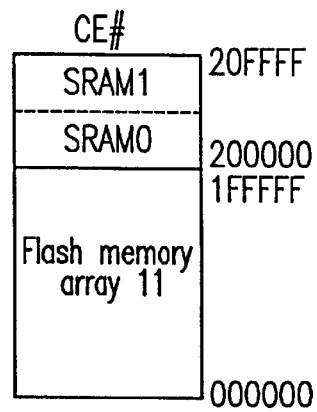
FIG. 5 shown an exemplary memory map of the semiconductor storage device 100 according to embodiment 1 of the present invention.

In the semiconductor storage device 100 according to embodiment 1, SRAM0, SRAM1, and the flash memory array 11 exists in different memory spaces as shown in a memory map of FIG. 5. An access by the external CPU 50 to SRAM0, SRAM1, or the flash memory array 11 is made based on a combinatorial logic of a chip enable signal CE# input from the CE# pin 31 which is a common control terminal and an address signal input through an address pin 35.

For example, when the external CPU 50 reads data from SRAM0 and SRAM1, a desired one of the addresses of SRAM0 and SRAM1, "200000" to "20FFFF" (FIG. 5), is input through the address pin 35, and the desired address is accessed based on the chip enable signal CE# input through the CE# pin 31 and an output enable signal CE# input through an OE# pin 33.

In this way, a memory array to be accessed can be automatically selected based on an input address. Thus, with only a single pin, i.e., the CE# pin 31, the external CPU 50 can access SRAM0, SRAM1, and the flash memory array 11.

Figure 6:
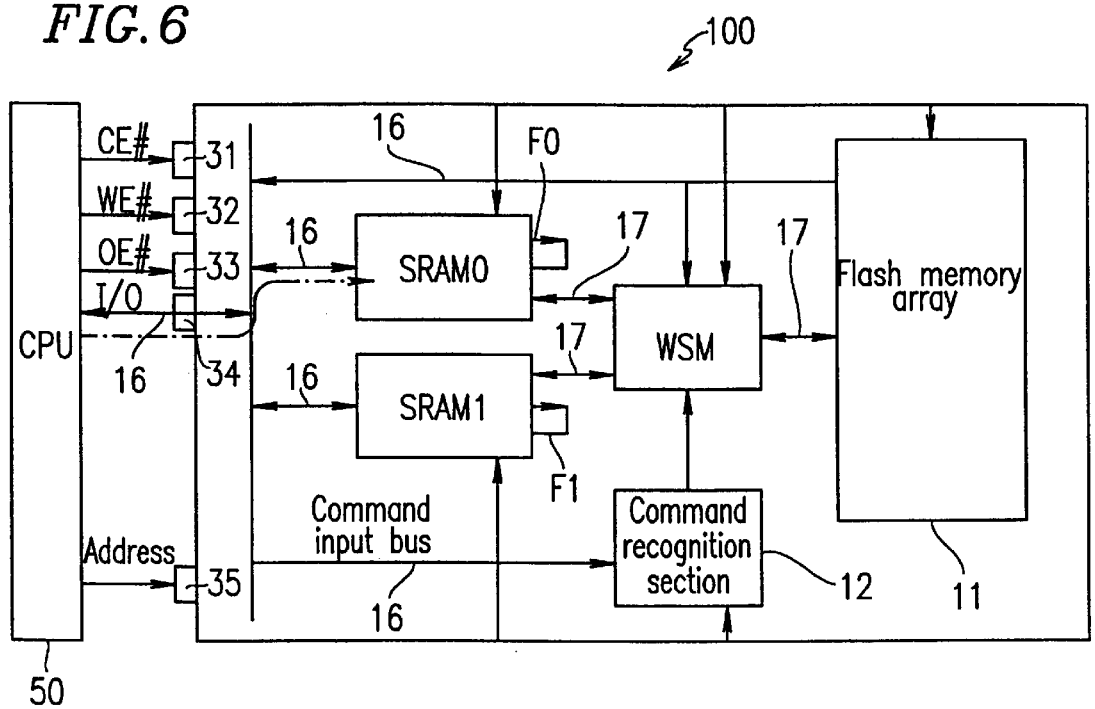
FIG. 6 shows a flow of data in the semiconductor storage device 100 when data is written in an SRAM array.
Figure 7:
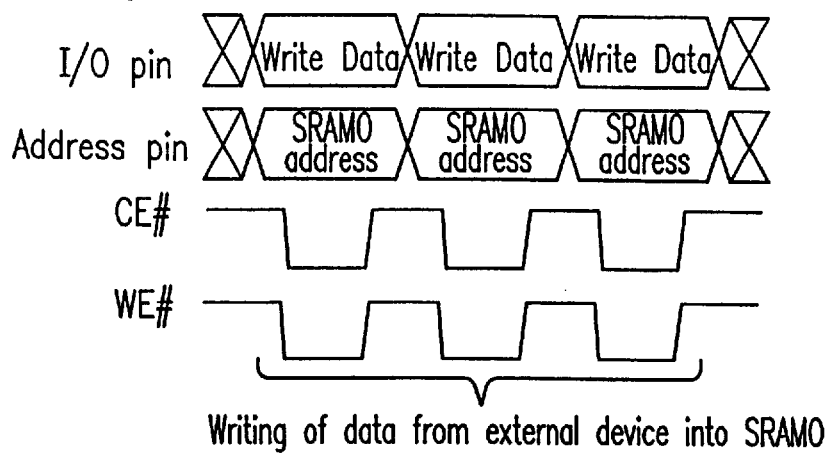
FIG. 7 is a timing chart which illustrates an example of a command to write data in the SRAM array.

An operation of the semiconductor storage device 100 having the above structure is now described. Firstly, a case where data input from the external CPU 50 is stored in the SRAM array is described. Specifically, a case where data is written in SRAM0 is described with reference to FIGS. 6 and 7. FIG. 7 is a timing chart which illustrates an example of a command to write data in SRAM0.

As shown in FIG. 7, data to be written, "Write Data", and an address, "SRAM0 address", are issued by the external CPU 50 through the I/O pin 34 and the input/output data bus 16 for starting a write operation. Then, when the chip enable signal CENT and a write enable signal WE# input through a WE# pin 32 are both at a low level, the data to be written, "Write Data", is written in an address within SRAM0 which is designated by the "SRAM0 address". In the case where a continuous series of data is written in SRAM0, the above write operation is repeatedly executed.

Typically, the input/output data bus 16 connected to the I/O pin 34 has a bus width of 16 bits or 8 bits. In such a case, data of 16 bits or 8 bits can be written in SRAM0 within a write cycle time of about 100 ns.

Thus, since an address in SRAM0 is designated in the address signal as an address in which data is to be stored, the data is reliably stored in the designated address in SRAM0.

Alternatively, in place of the write method described with reference to FIG. 7, data may be written in SRAM0 (or SRAM1) on the condition that the data is transferred to the flash memory array 11 later. In this case, a transfer command which initiates a transfer via SRAM0 is issued the external CPU 50 together with an address of the flash memory array. In the next command cycle, the amount of data to be written (i.e., the amount of data to be transferred) is issued together with an address of the flash memory array. Then, a write operation is executed-based on the chip enable signal CE# and a write enable signal WE#, whereby the data, "Write Data", is written in SRAM0 together with the address in the flash memory array 11 to which the "Write Data" will be transferred.

Figure 8:
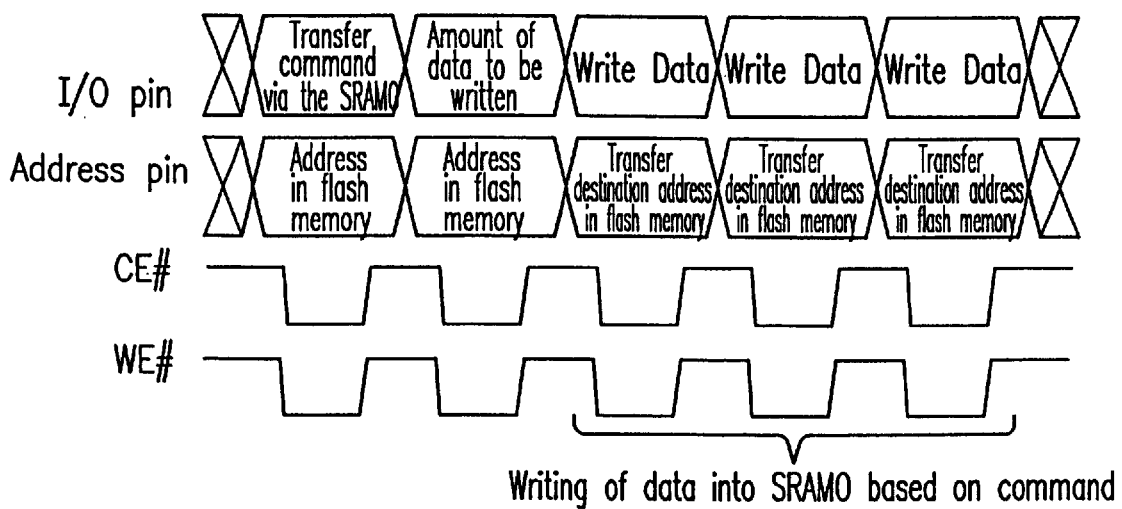
FIG. 8 is a timing chart which illustrates another example of a command to write data in the SRAM array.

In this case, since an address in the flash memory array 11 is designated in the address signal as an address in which data is to be stored, the command recognition section 12 recognizes that the first command is a command which initiates a data transfer to the address in the flash memory array 11. According to the data write method described with reference to FIG. 8, sets of the "Write Data" and addresses of the flash memory array 11 which can store an amount of the "Write Data" which is designated in the second command cycle are repeatedly written in SRAM0 in and after the third command cycle.

The time required for writing data in the SRAM array in about 100 ns, which is shorter than that required for writing the data in the flash memory array 11. Thus, the external CPU 50 is available for other operations after having written data in the SRAM array within a short time period.

As described above, in the case where data is directly written in the flash memory array 11 without temporarily storing the data in the SRAM, the external CPU 50 experiences a long standby time, which starts when the external CPU 50 issues a command of a data program operation in the flash memory array 11 and ends when a command of a next data program operation in the flash memory array 11 is started, because a long time is required for writing the data in the flash memory array 11 This standby time restricts the use of the external CPU 50. Thus, as the time required for writing data in the flash memory array 11 increases, the external CPU 50 is exclusively used for writing of data in the flash memory array 11, and is not available for other operations.

However, according to the semiconductor storage device 100 according to embodiment 1 of the present invention, data is written in the SRAM array within a short time period, and thereafter, the data stored in the SRAM array is transferred to the flash memory array 11 by the write state machine WSM. As a result, immediately after having written data in the SRAM array within a short time period, the external CPU 50 is available for other operations.

Figure 9:
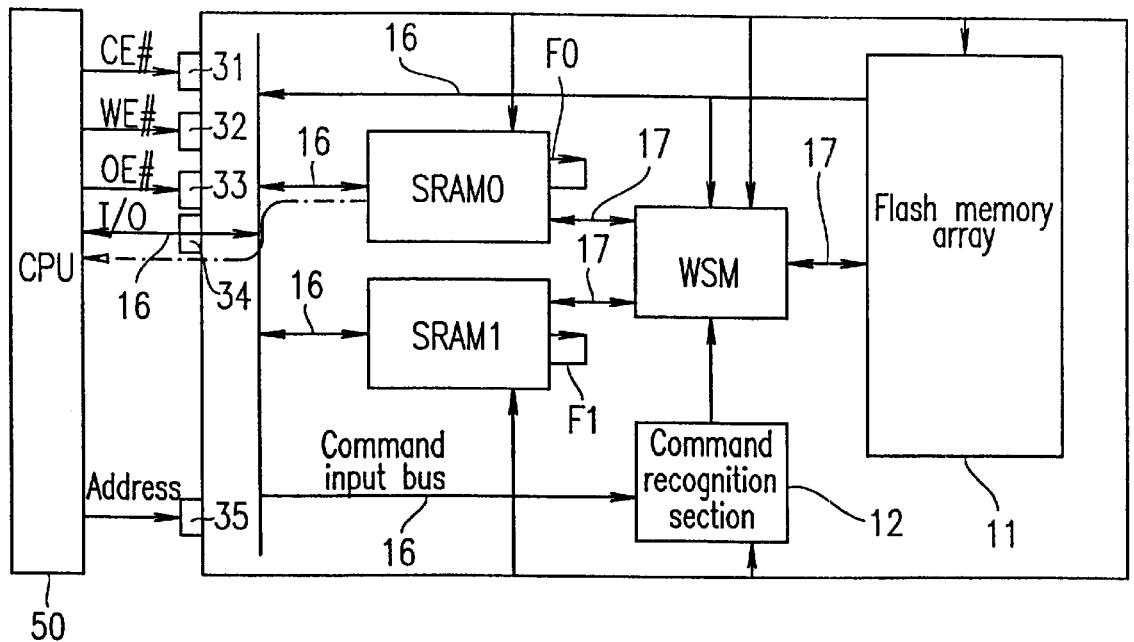
FIG. 9 shows a flow of data in the semiconductor storage device 100 when data is read from the SRAM array to an external CPU.
Figure 10:
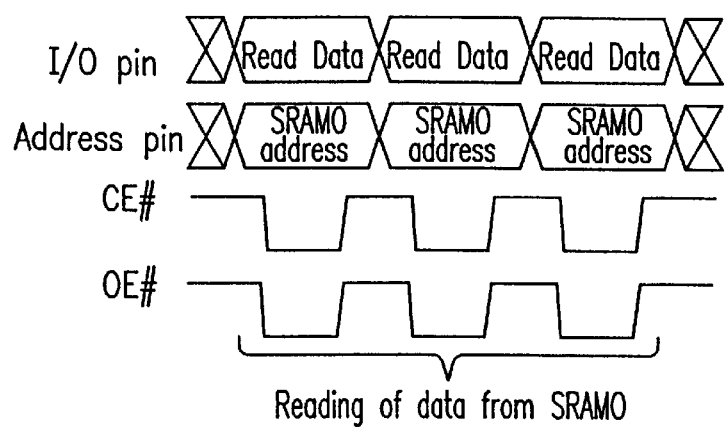
FIG. 10 is a timing chart which illustrates an example of a command to read data from the SRAM array.

Next, a case where data stored in the SRAM array is read by the external CPU 50 is described. Specifically, reading of data from SRAM0 is described with reference to FIGS. 9 and 10. FIG. 10 is a timing chart which illustrates an example of a command to read data from SRAM0.

The data read from SRAM0 is output to the external CPU 50 through the Input/output data bus 16 and the I/O pin 34. In the case where data stored in SRAM0 is read out, an address in SRAM0 from which data is to be read is designated, and the data in the designated address, "Read Data", is read out when the chip enable signal CE# and the output enable signal OE# are both at a low level. In the case where a continuous series of data is read from SRAM0, the above read operation is repeatedly executed.

Figure 11:
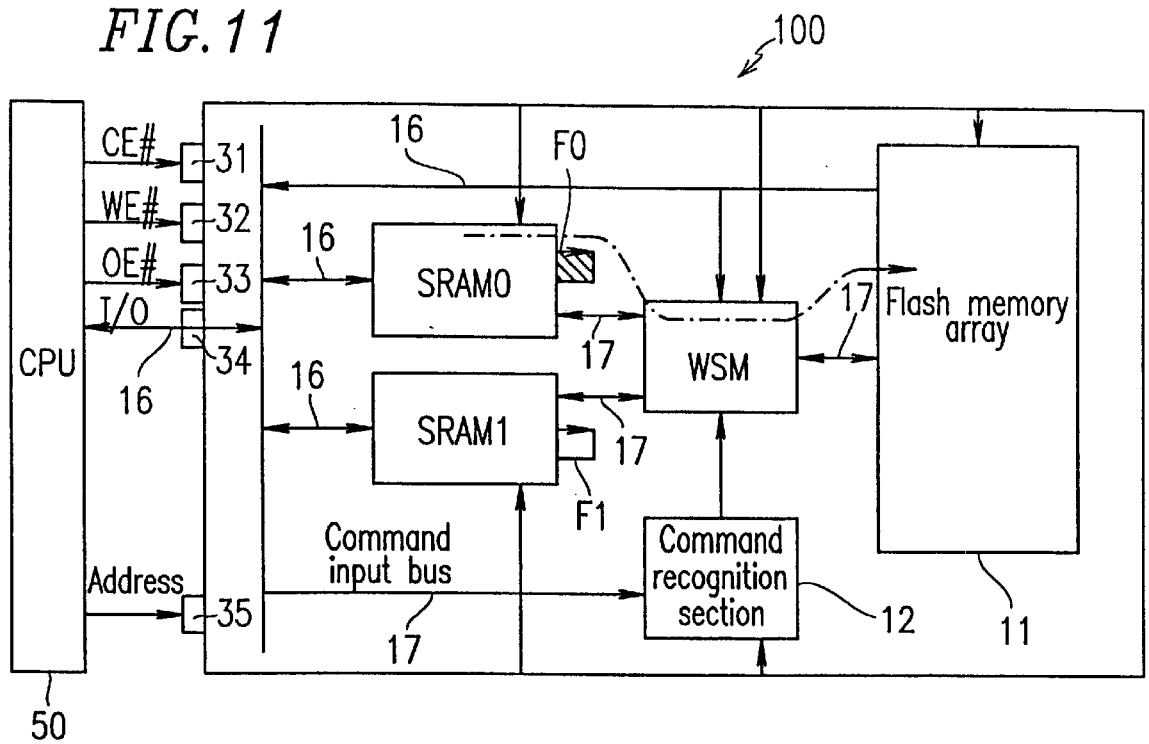
FIG. 11 shows a flow of data in the semiconductor storage device 100 when data is transferred from the SRAM array to a flash memory array.
Figure 12:
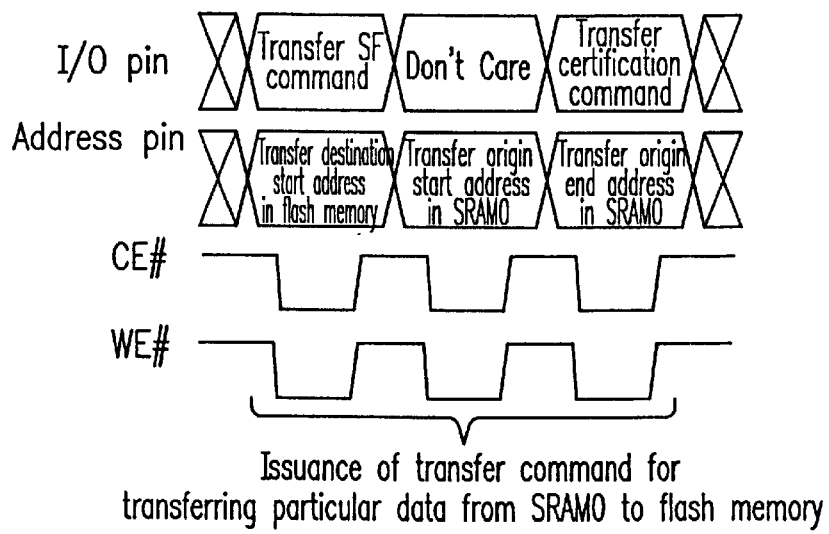
FIG. 12 is a timing chart which illustrates an example of a command to transfer data from the SRAM array to a flash memory array.

Next, a data transfer from the SRAM array to the flash memory array 11 is described. Specifically, a data transfer from SRAM0 to the flash memory array 11 is described with reference to FIGS. 11 and 12. FIG. 12 is a timing chart which illustrates an example of a command to transfer particular data in SRAM0 to the flash memory array 11.

After writing of data in SRAM0 has been completed in the above-described manner, when a user issues a data transfer command shown in FIG. 12, the write state machine WSM in the semiconductor storage device 100 starts to transfer data stored in an address in SRAM0, which is designated by the data transfer command, to an address in the flash memory array 11.

In the command sequence shown in FIG. 12, a transfer SF command is a command which directs the write state machine WSM to prepare for data transfer from the SRAM array to the flash memory array 11. The transfer confirmation command is a command which directs the write is state machine WSM to confirm whether or not input data is correct and whether or not a transfer can be started. Furthermore, a transfer destination start address in the flash memory array 11 indicates a first address in the flash memory array 11 to which the data is transferred. A transfer origin start address and a transfer origin end address in SRAM0 respectively indicate the first address and the last address in SRAM0 from which data to be transferred to the flash memory array 11 is read out.

After the command sequence shown in FIG. 12 has been issued, the write state machine WSM sets a flag F0 in SRAM0 which indicates an execution of transfer. With this flag P0, it can be recognized that the data is being transferred from SRAM0 to the flash memory array 11.

Thereafter, the write state machine WSM starts reading data from the designated transfer origin start address in SRAM0 in response to the command from the external CPU 50. Then, the data read from SRAM0 is written in the transfer destination start address in the flash memory array 11 according to the above-described write method. The write state machine WSM repeats such a process until all of the data to be transferred to the flash memory array 11 is transferred, whereby the data transfer from SRAM0 to the flash memory array 11 is completed.

Such a data transfer operation is automatically executed by the write state machine WSM in the semiconductor storage device 100 based on the commands supplied by the external CPU 50, whereby data in SRAM0 is transferred to any address in the flash memory array 11 without interruption. Thus, since the write state machine WSM in the semiconductor storage device 10o executes a data transfer from SRAM0 to the flash memory array 11, the external CPU 50 does not need to manage the writing of data in the flash memory array 11. Therefore, the external CPU 50 is available for other operations during the data transfer from SRAM0 to the flash memory array 11.

Figure 13:
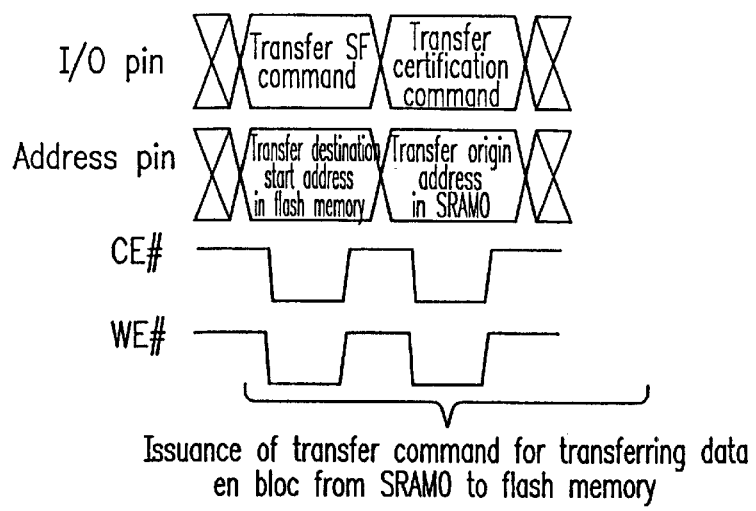
FIG. 13 is a timing chart which illustrates an example of a command to transfer all of the data in the SRAM array to the flash memory array en bloc.

FIG. 13 shows an example of a command which directs all of the data in SRAM0 to be transferred en bloc to the flash memory array 11. In this case, firstly, the transfer destination start address in the flash memory array 11 is supplied along with the transfer SF command. In the next command cycle, the transfer origin address in SRAM0 is supplied along with the transfer confirmation command.

After the command sequence shown in FIG. 13 is supplied from the external CPU 50, the write state machine WSM sets in SRAM0 a flag F0 which indicates an execution of transfer. Thereafter, the write state machine WSM reads data from the designated transfer origin start address in SRAM0 in response to the transfer SF command supplied from the external CPU 50. Then, the write state machine WSM writes the data read from SRAM0 in the transfer destination start address in the flash memory array 11 in the same manner as the above-described data program operation. The write state machine WSM repeats such a process until all of the data to be transferred to the flash memory array 11 (i.e., all of the data in SRAM0) is transferred, whereby the data transfer from SRAM0 to the flash memory array 11 is completed.

In the timing charts of FIGS. 12 and 13, the number of command cycles is 3 cycles and 2 cycles, respectively. However, according to the present invention, the number of command cycles may be set to any number of cycles.

Figure 14:
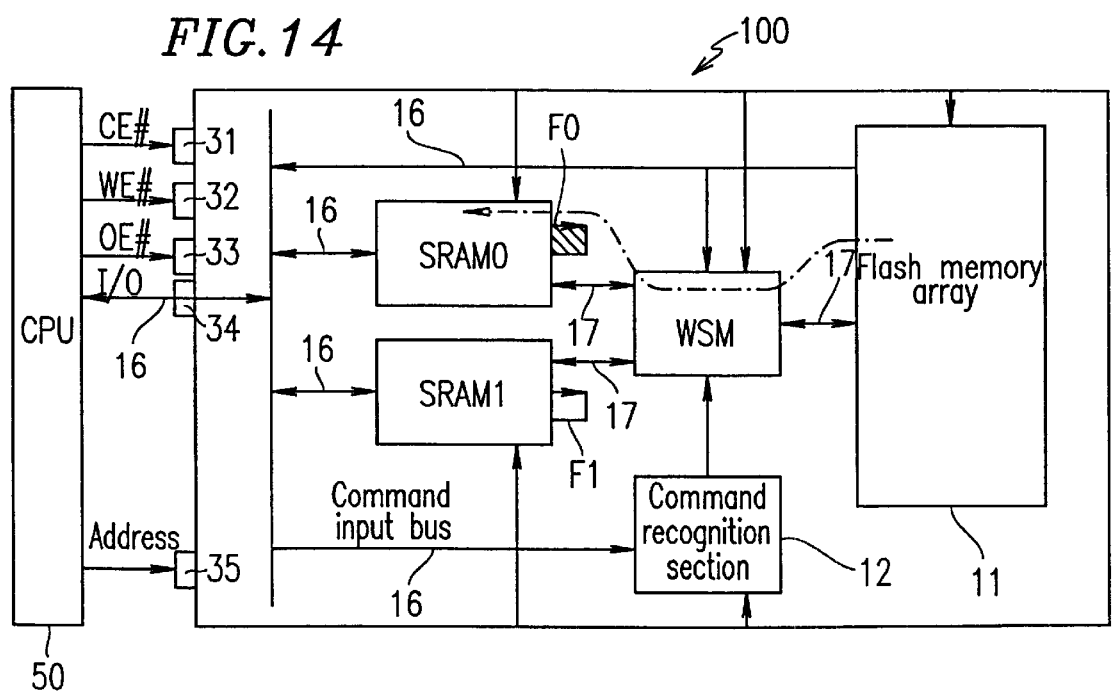
FIG. 14 shows a flow of data in the semiconductor storage device 100 when data is transferred from the flash memory array to the SRAM array.
Figure 15:
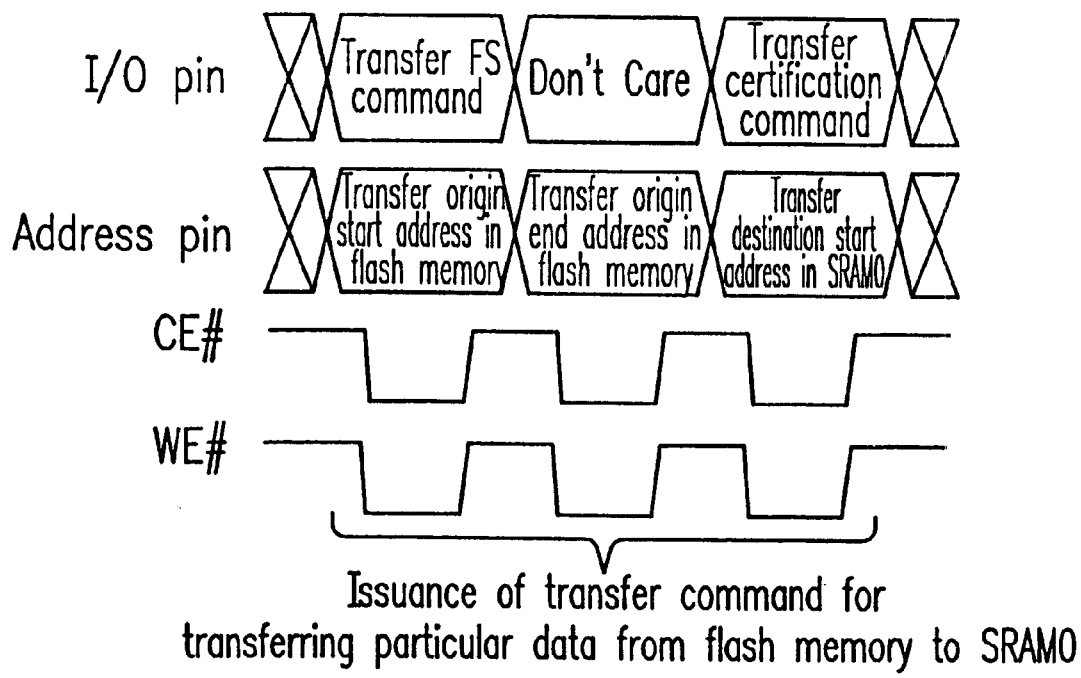
FIG. 15 is a timing chart which illustrates an example of a command to transfer data from the flash memory array to the SRAM array.

A data transfer from the flash memory array 11 to the SRAM array is now described. Specifically, a data transfer from the flash memory array 11 to SRAM0 is described with reference to FIGS. 14 and 15. FIG. 15 is a timing chart which illustrates an example of a command to transfer data in the flash memory array 11 to SRAM0.

In the command sequence shown in FIG. 15, a transfer FS command is a command which directs the write state machine WSM to prepare for data transfer from the flash memory array 11 to the SRAM array. The transfer confirmation command is a command which directs the write state machine WSM to confirm whether or not data included in the command sequence which has been input before the transfer confirmation command is correct and whether or not a transfer can be started. Furthermore, a transfer destination start address in SRAM0 indicates a first address to which the data is transferred. A transfer origin start address and a transfer origin end address in the flash memory array 11 respectively indicate the first address and the last address in the flash memory array it from which data to be transferred to SRAM0 is read out.

The write state machine WSM transfers data stored in the transfer origin start address through the transfer origin end address in the flash memory array 11 to the transfer destination start address and addresses subsequent thereto without interruption.

Specifically, after the data transfer command included in the command sequence of FIG. 15 is issued by the external CPU 50, the write state machine WSM in the semiconductor storage device of the present invention starts a data transfer from the designated address in the flash memory array 11 (transfer origin start address) to the designated address in SRAM0 (transfer destination start address).

After the command sequence shown in FIG. 15 has been issued, the write state machine WSM sets in SRAM0 a flag F0 which indicates an execution of transfer. With this flag F0, it can be recognized that data is being transferred from the flash memory array 11 to SRAM0.

Thereafter, the write state machine WSM starts reading data from the designated transfer origin start address in the flash memory array 11 in response to the command from the external CPU 50. Then, the data read from the flash memory array 11 is written in the transfer destination start address in SRAM0 according to the above-described write method. The write state machine WSM repeats such a process until all of the data to be transferred to SRAM0 is transferred, whereby the data transfer from the flash memory array 11 to SRAM0 is completed.

Figure 16:
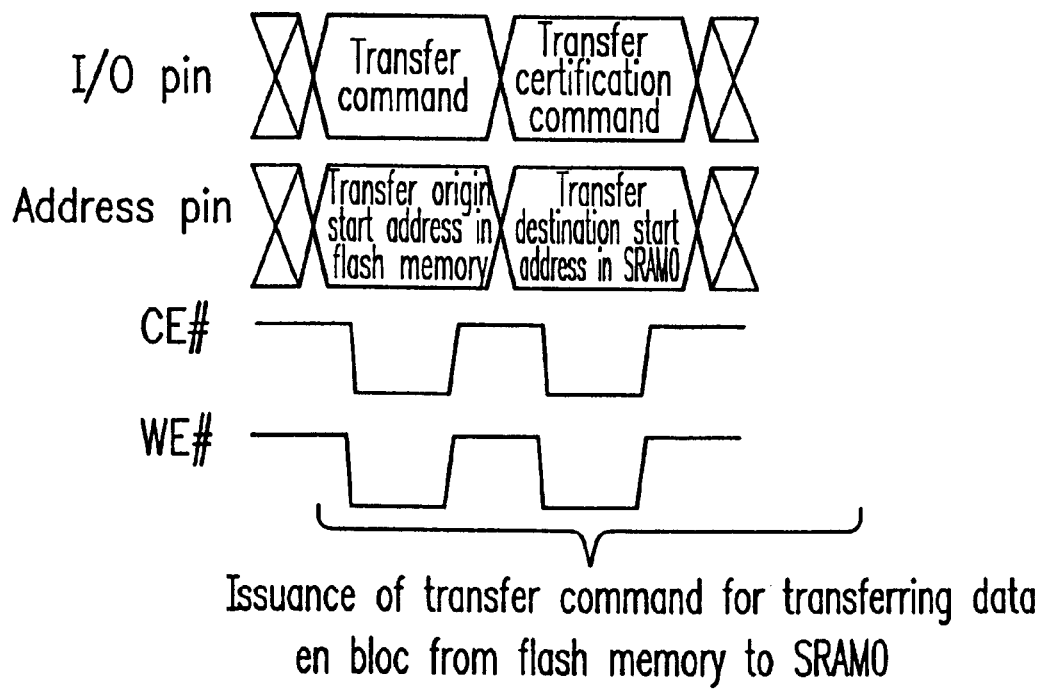
FIG. 16 is a timing chart which illustrates another example of a command to transfer data from the flash memory array to the SRAM array.

FIG. 16 shows an example of a command which directs all of the data in the flash memory array 11 to be transferred en bloc to SRAM0. In this case, after the command sequence shown in FIG. 16 is supplied from the external CPU 50, the write state machine WSM sets in SRAM0 a flag F0 which indicates an execution of transfer. Thereafter, the write state machine WSM reads data from the designated transfer origin start address in the flash memory array 11 in response to the transfer command supplied from the external CPU 50. Then, the write state machine WSM writes the data read from the flash memory array 11 in the transfer destination start address in SRAM0 in the same manner as the above-described data write operation. The write state machine WSM repeats such a process until all of the data to be transferred to SRAM0 (i.e., all of the data in the flash memory array 11) is transferred, whereby the data transfer from the flash memory array 11 to SRAM0 is completed.

In the timing charts of FIGS. 15 and 16, the number of command cycles is 3 cycles and 2 cycles, respectively. However, according to the present invention, the number of command cycles ray be set to any number of cycles.

Next, operations which can be executed by the external CPU 50 during the data transfer from the SRAM array to the flash memory array it will be described.

Figure 17:
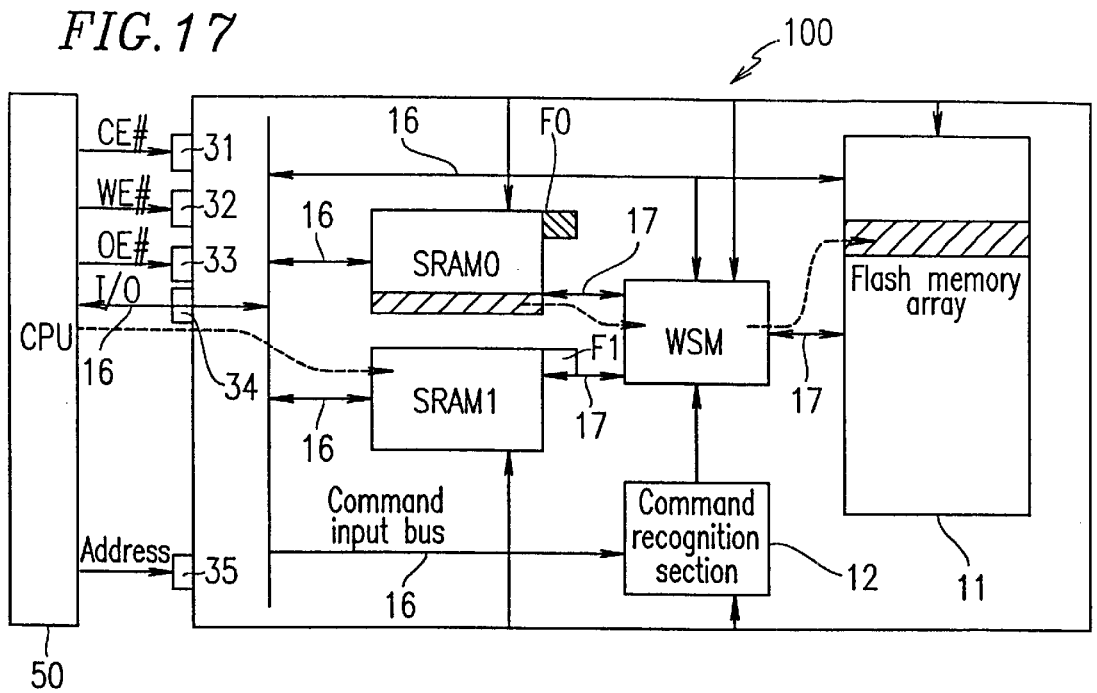
FIG. 17 shows a flow of data in the semiconductor storage device 100 when data is written into the SRAM array during a data transfer from the SRAM array to the flash memory array.
Figure 18:
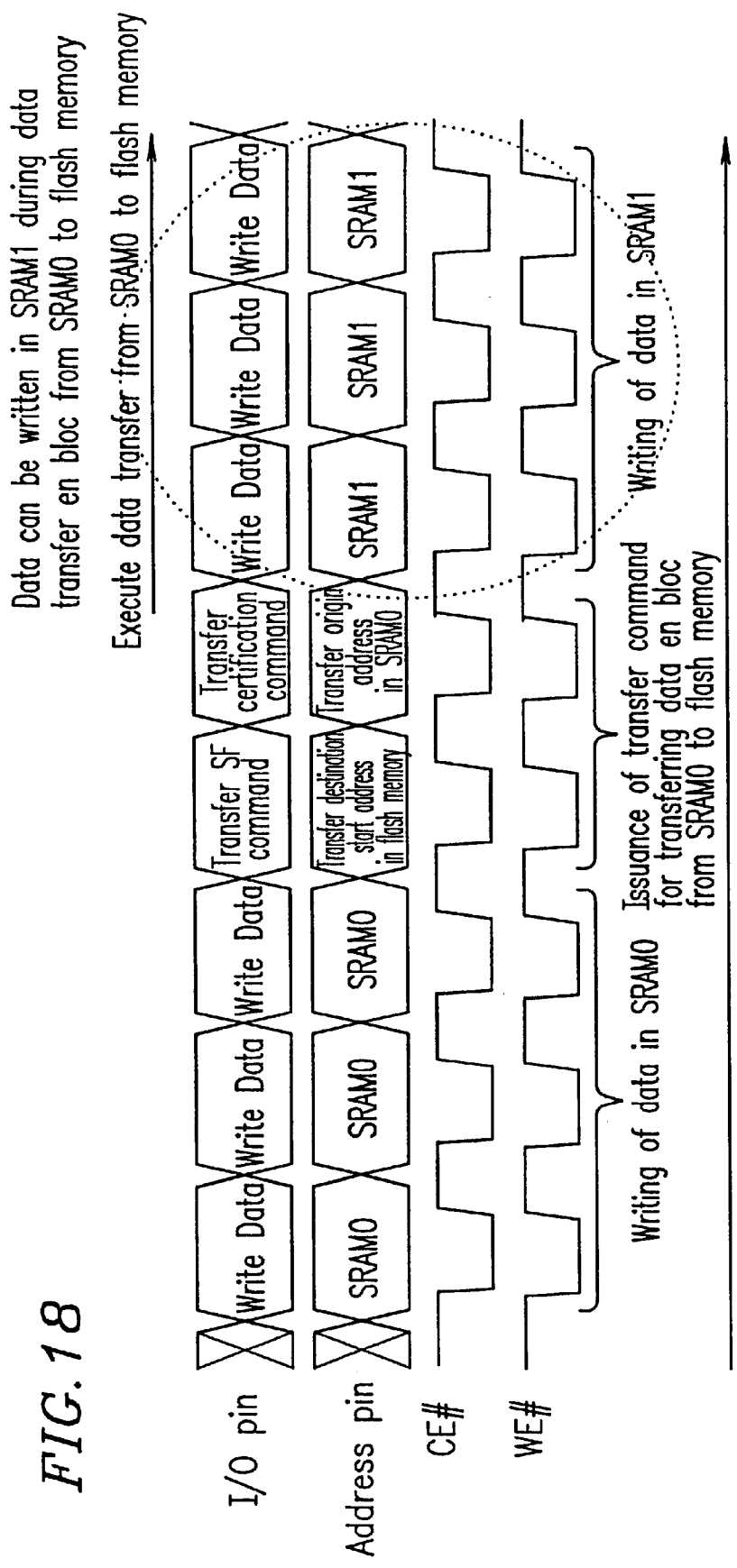
FIG. 18 is a timing chart for achieving the flow of data shown in FIG. 17.

FIG. 17 shows a flow of data when data is written from the outside of the semiconductor storage device 100 into SRAM1 during a data transfer from SRAM0 to the flash memory array 11. FIG. 18 is a timing chart for achieving the flow of data shown in FIG. 17.

first, in the same manner as the timing chart shown in FIG. 7, data is written in a designated address in SRAM0. Then, in the same manner as the timing chart shown in FIG. 13, the write state machine WSM receives a transfer destination start address it the flash memory array 11 together with a transfer SF command. In the next command cycle, the write state machine WSM receives a transfer origin start address in SRAM0 together with the transfer certification command. Based on these addresses and the commands included in the command sequence shown in FIG. 18, the write state machine WSM transfers data from SRAM0 to the flash memory array 11.

Then, the external CPU 50 writes data in a designated address in SRAM1 in the same manner as the timing chart shown in FIG. 7. During the writing of data by the external CPU 50, the write state machine WSM in the semiconductor storage device 100 is transferring the date from SRAM0 to the flash memory array 11.

Naturally, even in the case where data is transferred from the flash memory array 11 to SRAM0 as described with reference to FIGS. 14, 15, and 16, the external CPU 50 can access SRAM1.

As described above, the semiconductor storage device 100 of the present invention includes SRAM0 and SRAM1 which operate separately from each other. Thus, the external CPU 50 can access SRAM1, and accordingly write data in or read data from SRAM1, during the data transfer from SRAM0 to the flash memory array 11 or during the data transfer from the flash memory array 11 to SRAM0.

Figure 19:
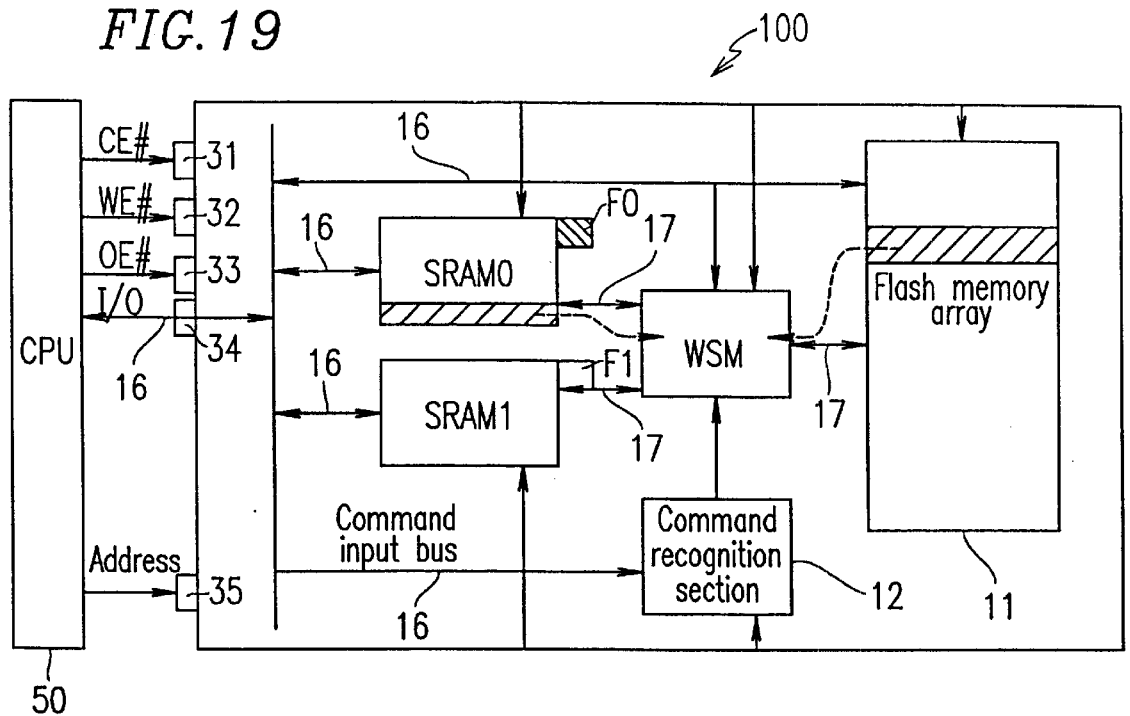
FIG. 19 shows a flow of data in the semiconductor storage device 100 when a data transfer is not executed between the SRAM array and the flash memory array.

In the semiconductor storage device 100 of the present invention, in the case where the write state machine WSM executes a data transfer, the write state machine WSM may compare data at a transfer origin with data at a transfer destination. If the data at the transfer origin is the same as the data at the transfer destination, the data transfer may be cancelled. A flow of data in such a case is shown in FIG. 19.

A case where data in the flash memory array 11 is transferred to SRAM0 is described with reference to FIG. 19. Receiving the data transfer command, the write state machine WSM reads data from the flash memory array 11 (transfer origin), and on the other hand, reads data from SRAM0 (transfer destination) Then, the write state machine WSM compares these data. If these data are identical, the data read from the flash memory array is not transferred to SRAM0. If these data are different, the data read from the flash memory array 11 is transferred to and written in SRAM0. Such a process is executed for each data transfer.

Thus, since a data transfer is not executed when the data at the transfer origin and the data at the transfer destination are identical, the time required for data transfer can be reduced.

Alternatively, according to the present invention, during a data transfer from SRAM0 to the flash memory array 11 or during a data transfer from the flash memory array 11 to SRAM0, a data transfer status of an SRAM array which is used for the data transfer may be output to the external CPU 50 by means of a status register or polling. For example, in the storage device 100 shown in FIG. 19, during the data transfer from SRAM0 to the flash memory array 11, the flag P0 which indicates that data in SRAM0 is being transferred is output to the external CPU 50.

For example, the external CPU 50 supplies the semiconductor storage device 100 with a predetermined command to turn the storage device 100 into a status register read mode, whereby flag information which indicates data transfer for SRAM0 and SRAM1 is output to the input/output pin 34. Then, by manipulating the CE# pin 31 and the OE# pin 33, the flag information at the input/output pin 34 is read by the external CPU 50. Which information (i.e., information for SRAM0 or information for SRAM1) is output is determined according to an address supplied from the external CPU 50 through the address pin 35.

Furthermore, when a write access or a read access to SRAM0 or SRAM1 is made by the external CPU 50 during a data transfer from SRAM0 or SRAM1 to the flash memory array 11, the access may by prohibited. For example, when the external CPU 50 inputs to the semiconductor storage device 100 an access signal for reading data from or writing data in SRAM0 while the write state machine WSM is transferring data in SRAM0 to the flash memory array 11, this access signal is disabled for prohibiting the access by the external CPU 50 to SRAM0. A flow of data in such a case is shown in FIG. 20.

Figure 20:
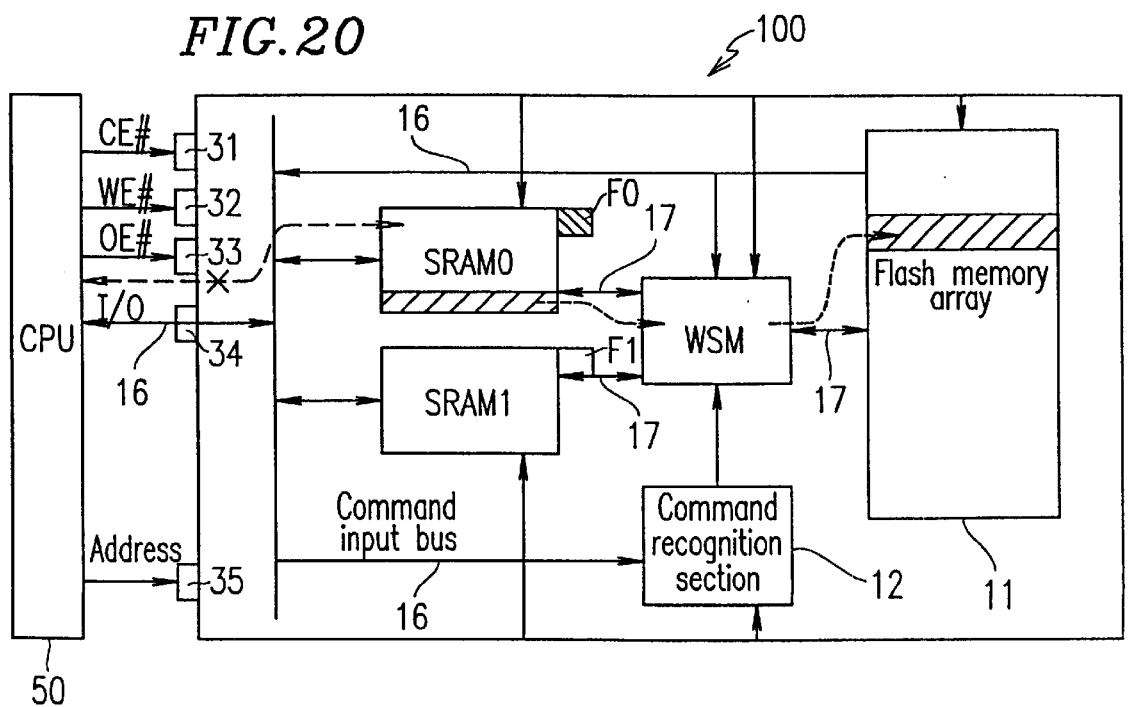
FIG. 20 shows a flow of data in the semiconductor storage device 100 when writing of data into the SRAM array is prohibited during a data transfer from the SRAM array to the flash memory array.

As shown in FIG. 20, in this case, the flag F0 which indicates that.data in SRAM0 is being transferred to the flash memory array 11 is set in SRAM0 by the write state machine WSM. In the case where the external CPU 50 inputs to the semiconductor storage device 100 an access signal for reading data from or writing data in SRAM0, the access by the external CPU 50 to SRAM0 is prohibited in response to a combinatorial logic of a set signal for the flag P0 and the access signal from the external CPU 50. (This prohibition mechanism is incorporated in the structure of a hardware, i.e., the semiconductor storage device 100.) With such a mechanism, the write state machine WSM can execute the data transfer from SRAM0 to the flash memory array 11 without being interrupted.

In the above example, the prohibition mechanism is incorporated in a structure of a hardware. However, according to the present invention, the access by the external CPU 50 to SRAM0 may be prohibited by a command or an external control terminal.

Conversely, according to the present invention, when a write access or a read access to SRAM0 or SRAM1 is made by the external CPU 50 during a data transfer from SRAM0 or SRAM1 to the flash memory array 11, the access by the external CPU 50 may be dealt with prior to the data transfer. For example, when the external CPU 50 inputs to the semiconductor storage device 100 an access signal for reading data from or writing data in SRAM0 while the write state machine WSM is transferring data in SRAM0 to the flash memory array 11, the access by the external CPU 50 may be dealt with prior to the data transfer by interrupting the data transfer. A flow of data in such a case is shown in FIG. 21.

Figure 21:
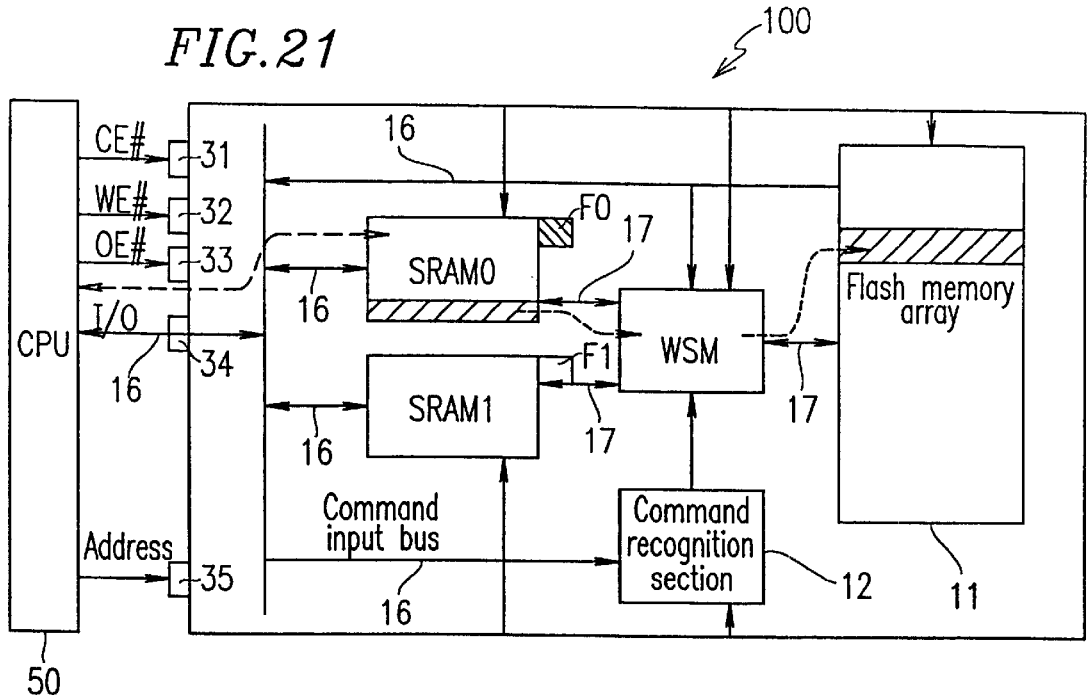
FIG. 21 shows a flow of data in the semiconductor storage device 100 in the case of outputting to the external CPU information indicating transfer state data, i.e., indicating that data is being transferred from the SRAM array to the flash memory array.

As shown in FIG. 21, in this case, the flag F0 which indicates that data in SRAM0 is being transferred to the flash memory array 11 is set in SRAM0 by the write state machine WSM. In the case where the external CPU 50 inputs to the semiconductor storage device 100 an access signal for reading data from or writing data in SRAM0, in response to a combinatorial logic of a set signal for the flag P0 and the access signal from the external CPU 50, the external CPU 50 supplies the write state machine WSM with an interrupt signal for interrupting the data transfer from SRAM0 to the flash memory array 11. In response to the interrupt signal, the write state machine WSM suspends the data transfer from SRAM0 to the flash memory array 11 and allows the external CPU 50 to access SRAM0.

Thereafter, the external CPU 50 accesses SRAM0 to read data from or write data in SRAM0. After the reading or writing of data is completed, the interrupt signal is disabled. The write state machine WSM then resumes the data transfer from SRAM0 to the flash memory array 11.

As described above, the data transfer from the SRAM array to the flash memory array 11 is automatically executed by the write state machine WSM in the semiconductor storage device 100 based on the commands supplied by the external CPU 50. Thus, even when data is being transferred between one of the SRAM arrays (in the above example, SRAM0) and the flash memory array 11, the external CPU 50 can read data from or write data in the other SRAM array (SRAM1), or the external CPU 50 can read data from, write data in, or erase data from the flash memory array 11. Since a restriction on an operation of the external CPU 50 is lightened, the processing capacity of the external CPU 50 improves.

In the above example, the mechanism for interrupting the data transfer from SRAM0 to the flash memory array 11 is incorporated in a structure of a hardware. However, according to the present invention, the data transfer may be interrupted by a command or an external control terminal.

Figure 22:
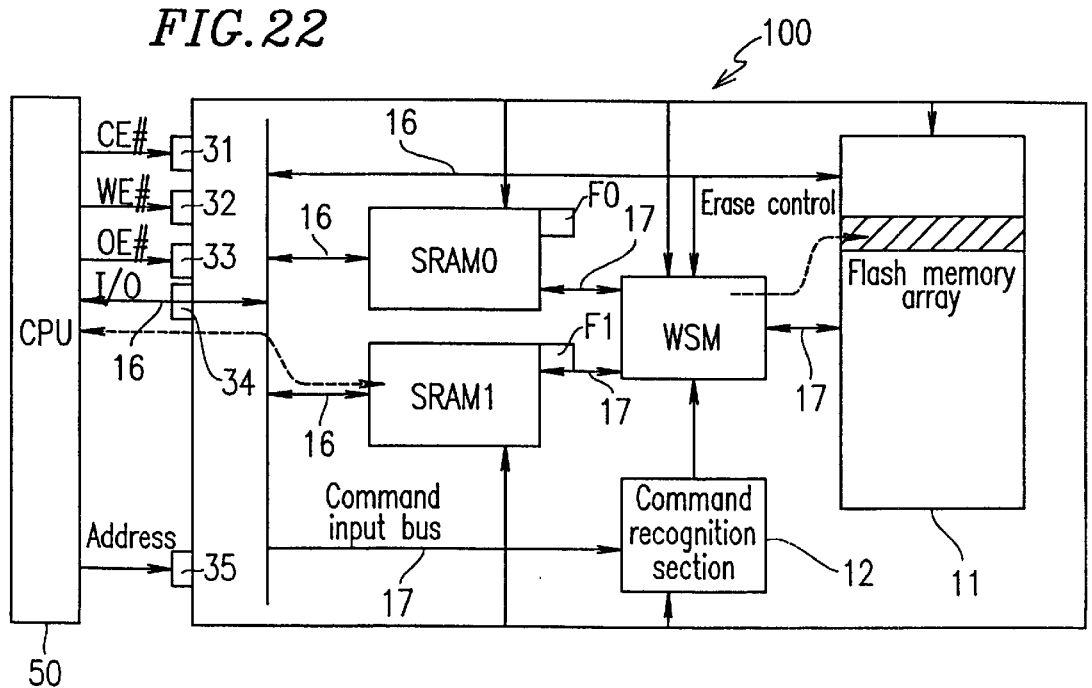
FIG. 22 shows a flow of data when the external CPU writes data in or reads data from the SRAM array during a block erase operation being executed in the flash memory array 11.
Figure 23:
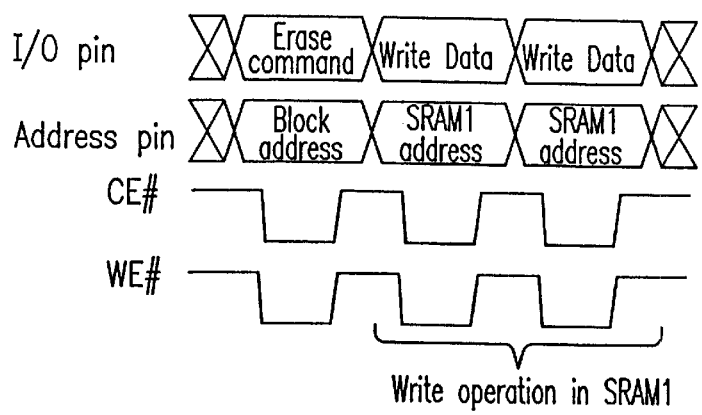
FIG. 23 is a timing chart for achieving the flow of data shown in FIG. 22.

Furthermore, in the semiconductor storage device 100 of the present invention, the external CPU 50 may write data in or read data from the SRAM array through the I/O pin 34 during a block erase operation where data in a block of the flash memory array 11 is erased en bloc or during the writing of data in the flash memory array 11. FIG. 22 shows a flow of data when the external CPU 50 writes data in or reads data from the SRAM through the I/O pin 34 during a block erase operation being executed in the flash memory array 11. FIG. 23 is a timing chart which shows an example of a command used in such a case.

In this case, in response to a receipt by the semiconductor storage device 100 of an erase command supplied by the external CPU 50 for erasing a particular block in the flash memory array 11, an address of the block from which data is to be erased is stored in the write state machine WSM, and the write state machine WSM starts a block erase operation for the block in the flash memory array 11 which is designated by the erase command.

During the data erasure by the write state a machine WSM from the block in the flash memory array 11, the external CPU 50 executes reading of data from SRAM1 or writing of data in SRAM1 through the address pin 35 and the I/O pin 34. Thus, the block erasure by the write state machine WSM and the access operation by the external CPU 50 to the SRAM array can be executed in a parallel manner.

In the semiconductor storage device 100 of the present invention, one of SRAM0 and SRAM1 may have a capacity equal to that of a block in the flash memory array 11 from which data can be erased en bloc, or may have a capacity which is a multiple or divisional of the capacity of a block in the flash memory array 11 from which data can be erased en bloc. In such a case, a part of data written in a block of the flash memory array 11 can be readily transferred to SRAM0 or SRAM1.

Figure 24:
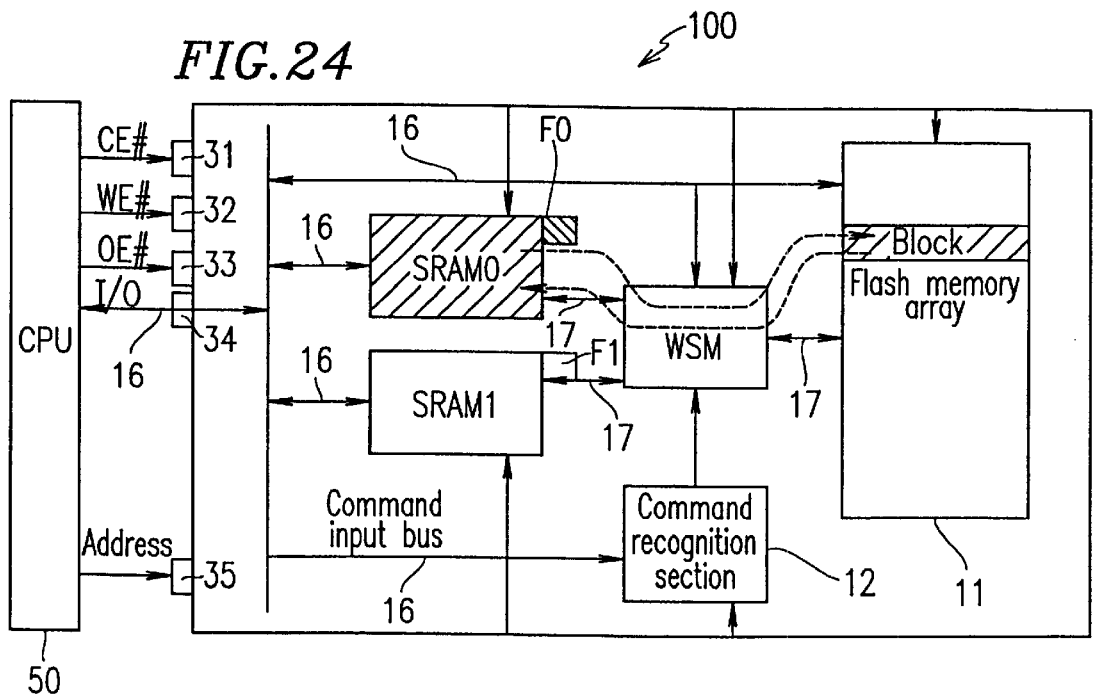
FIG. 24 shows a flow of data during a data transfer in the semiconductor storage device 100 where the SRAM array has a capacity equal to that of a block in the flash memory array.

FIG. 24 shows a flow of data in the semiconductor storage device 100 where SRAM0 has a capacity equal to that of one block of the flash memory array 11. When a part of data written in a block of the flash memory array 11 is replaced, all of the data stored in the block of the flash memory array 11 (which is equal to the capacity of SRAM0) is transferred by the write state machine WSM to SRAM0 so as to be temporarily stored therein. Then, the date in the block of the flash memory array 11 is erased. During the data erasure from the block, a part of the data temporarily stored in SRAM0 is replaced with other data. After the data erasure from the block of the flash memory array 11 is completed, all of the data temporarily stored in SRAM0 is transferred by the write state machine WSM to the block from which the previous data has been erased.

Thus, in the semiconductor storage device 100 where SRAM0 has a capacity equal to that of one block of the flash memory array 11, when data is transferred between the flash memory array 11 and SRAM0, the transfer destination address (address to which the data is to be transferred) can be readily designated.

Alternatively, in the semiconductor storage device 100 where each of SRAM0 and SRAM1 has a capacity which is a half of the capacity of one block of the flash memory array 11, data In the block of the flash memory array 11 is divided into halves, and the respective halves are transferred to SRAM0 and SRAM1 en bloc. After the data transfer to SRAM0 and SRAM1, the data in the block of the flash memory array 11 is erased. During the data erasure from the block, a part of the data temporarily stored in SRAM0 and SRAM1 is replaced with other data. After the data erasure from the block of the flash memory array 11 is a completed, all of the data temporarily stored in SRAM0 and SRAM1 is transferred en bloc by the write state machine WSM to the block from which the previous data has been erased.

In this case also, when data is transferred between the flash memory array 11 and SRAM0 and SRAM1, the transfer destination address (address to which the data is to be transferred) can be readily designated.

Figure 25B:
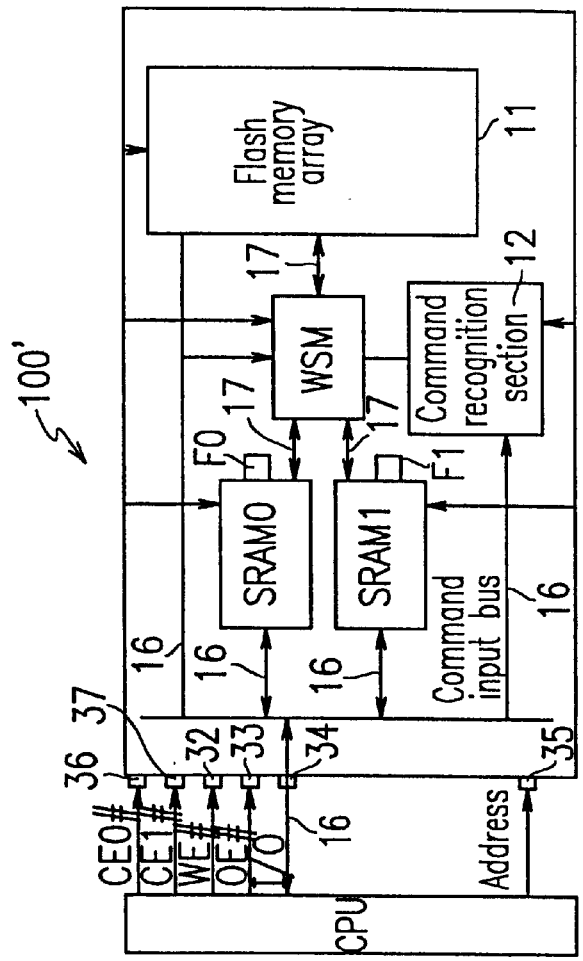
FIG. 25B shows a structure of a semiconductor storage device 100 according to embodiment 1 of the present invention which has the memory map shown in FIG. 25A.
Figure 25A:
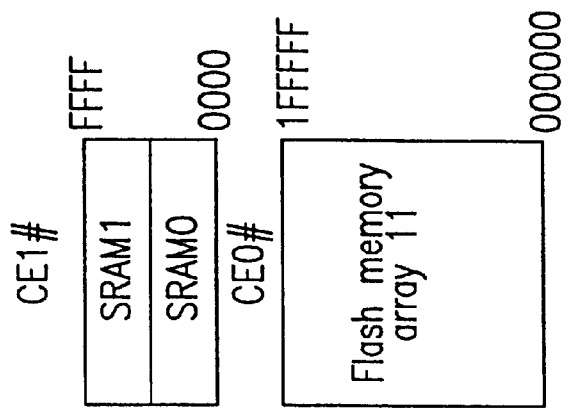
FIG. 25A shows another example of a memory map of a semiconductor storage device according to embodiment 1 of the present invention.

In the semiconductor storage device 100 of the present invention, the SRAM arrays (SRAM0 and SRAM1) and the flash memory array 11 may exist in the same memory space as shown in FIG. 25A. In such a case. SRAM0 and SRAM1 and the flash memory array 11 may be controlled by different control signals. For example, a semiconductor storage device 100' shown in FIG. 25D includes a CE0# pin 36 and a,CE1# pin 37. Through the CE0# pin 36, a CE0# signal for controlling the flash memory array 11 is input. Through the CE1# pin 37, a CE1# signal for controlling SRAM0 and SRAM1 is input. Accesses by the external CPU so to the flash memory array 11 and SRAM0 and SRAM1 are achieved by a switching between the CE0# pin 36 and the CE1# pin 37.

For example, in the semiconductor storage device 100' where both a memory space of SRAM0 and SRAM1 and a memory space of the flash memory array 11 include an address "000000", when the address "000000" is input along with the output enable signal OE# input through the OE# pin 33 and the chip enable signal input through the CE0# pin 36, data is reliably read from the address "000000"0 in the flash memory array 11.

Since in the semiconductor storage device 100' which has the CE0# pin 36 and the CE1# pin 37, the SRAM arrays and the flash memory array 11 can be operated separately from each other, a function of the SRAM arrays, such as a data maintain mode, can be used. Furthermore, the semiconductor storage device 100' can be readily replaced with a stacked package product including an SRAM and a flash memory which is used in, for example a portable phone, etc., as long as the storage device 100' has compatibility for terminal operations with the portable phone.

Figure 26:
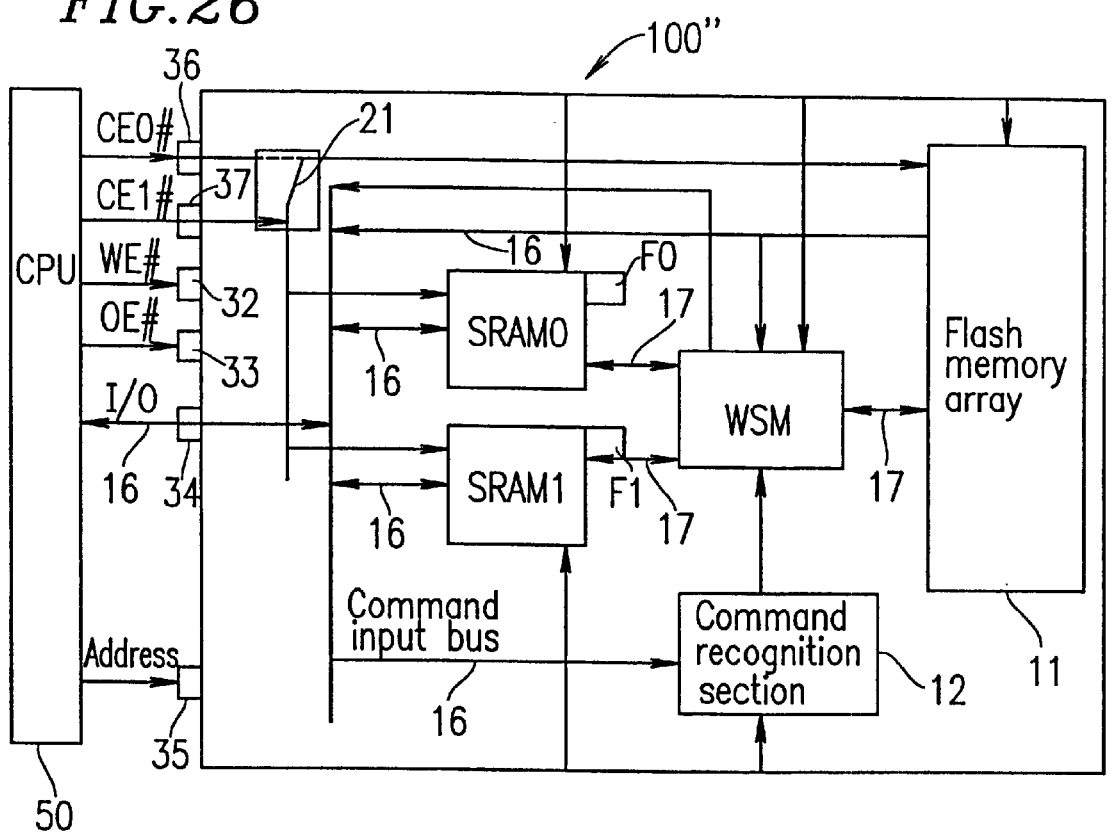
FIG. 26 shows a structure of a semiconductor storage device 100 according to embodiment 1 of the present invention.

FIG. 26 shows a semiconductor storage device 100" including a chip enable switch 21 which switches the operation mode between two modes: in one mode, a CE0# pin 36 is used, but a CE1# pin 37 is not used; in the other mode, both the CE0# pin 36 and the CE1# pin 37 are used. Specifically, in the first mode, an access to SRAM0 and SRAM1 and the flash memory array 11 is achieved according to a chip enable signal input through the CE0# pin 36 and an address signal. In the second mode, an access to the flash memory array 11 is achieved according to the chip enable signal input through the CE0# pin 36 and the address signal, and an access to SRAM0 and SRAM1 is achieved according to the chip enable signal input through the CE1# pin 37 and the address signal. With such a switching mechanism, the semiconductor storage device 100" can readily establish compatibility with a system including the external CPU 50.

The chip enable switch 21 is not limited to a structure where the switching is achieved by control terminals provided to the storage device 100". According to the present invention, the switching may be achieved by a predetermined command.

Embodiment 2

Figure 27:
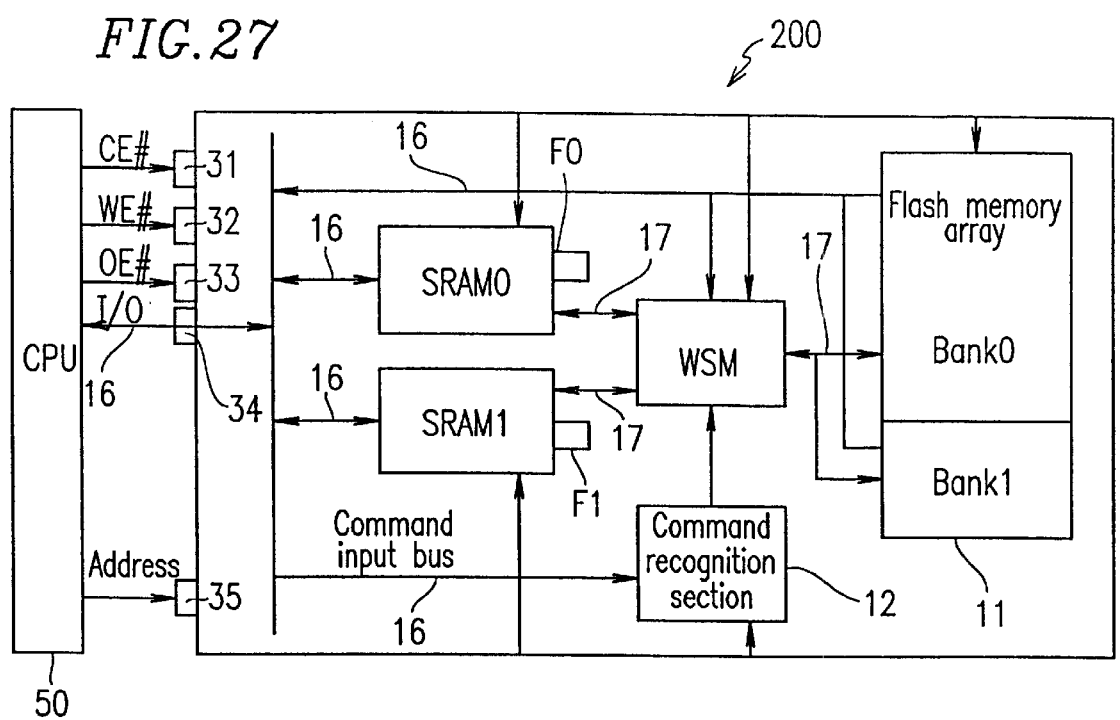
FIG. 27 shows a structure of a semiconductor storage device 200 according to embodiment 2 of the present invention.

FIG. 27 shows a structure of a semiconductor storage device 200 according to embodiment 2 of the present invention. In the semiconductor storage device 200, a flash memory array 11 includes Bank0 and Bank1. In one of Bank0 and Bank1, writing, erasing, and reading of data can be executed separately from those executed in the other Bank. Note that the flash memory array 11 may include two or more banks.

Figure 28:
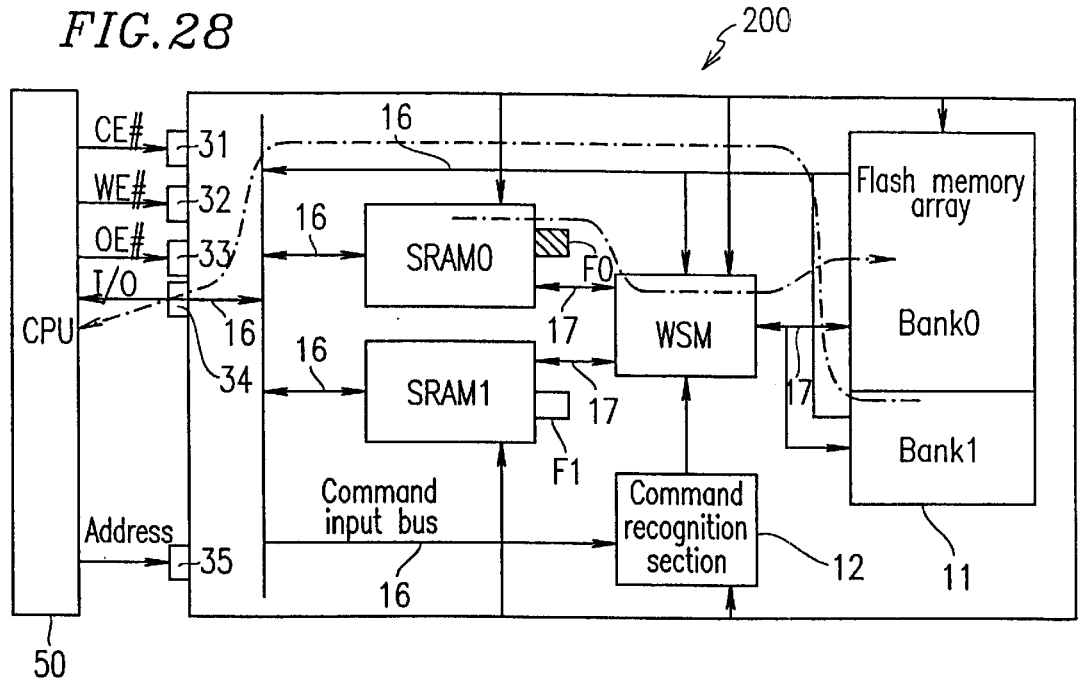
FIG. 28 shows a flow of data in the semiconductor storage device 200 when data is transferred from/to banks in a flash memory array.

Generally, as disclosed in Japanese Laid-Open Publication No. 10-144086, in a flash memory including a plurality of banks, a read operation in one bank can be executed in parallel with a program operation or erase operation in other bank. Thus, in addition to the operations executable during a data transfer between a bank in the flash memory and SRAM0 and SRAM1 (as described in embodiment 1, for example, writing of data in SRAM0 and SRAM1 and reading of data in SRAM0 and SRAM1), data can be read from a bank which does not include a data transfer origin or a data transfer destination to the external CPU 50. FIG. 28 shows a flow of data when data is read from Bank1 to an external CPU 50 during a data transfer from SRAM0 to Bank0 of the flash memory array 11.

Figure 29:
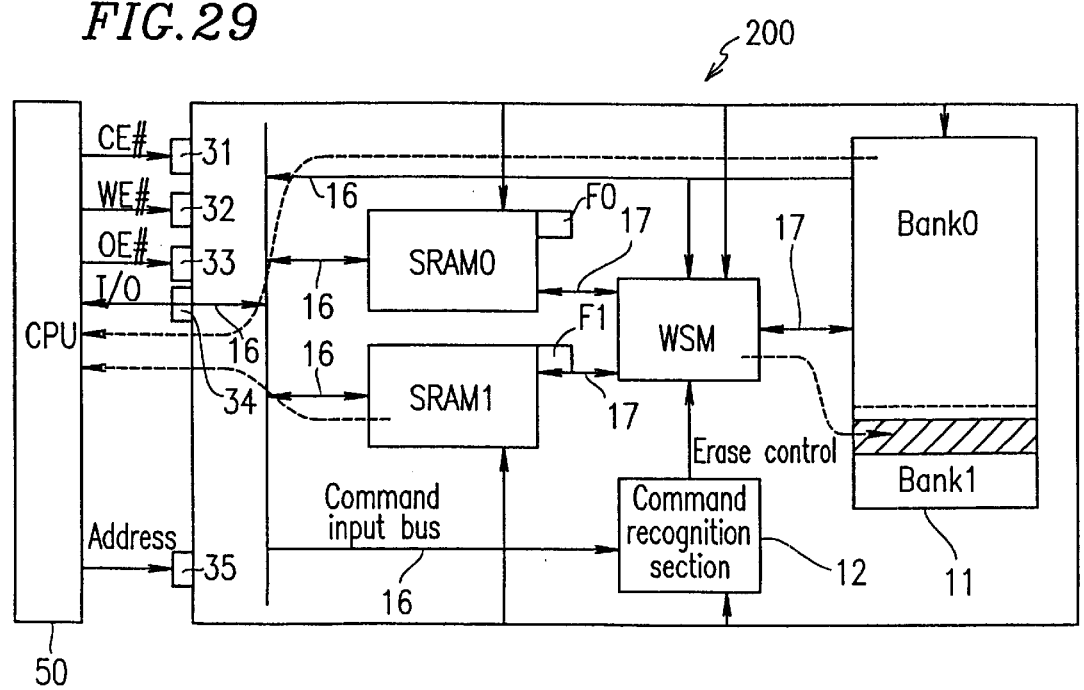
FIG. 29 shows a flow of data in the semiconductor storage device 200 during an erase operation in a bank of the flash memory array.

Furthermore, in the flash memory array 11 including a plurality of banks, during a block erase operation by the write state machine WSM or a program operation in Bank1 by the external CPU 50, the external CPU 50 can access SRAM0 or SRAM1 (for executing, for example, a read operation or a write operation) and read data from Bank0 of the flash memory array 11. A flow of data in such a case is shown in FIG. 29.

In this case, in response to a receipt of a block erase command by the write state machine WSM, an address of a block in Bank1 of the flash memory array 11 from which data is to be erased is stored in the write state machine WSM, and then, the write state machine WSM starts a block erase operation for the block in Bank1 of the flash memory array it.

During this block erase operation in Bank1 by the write state machine WSM, the external CPU 50 reads data from or writes data in SRAM1 through the address pin 35 and the I/O pin 34. Furthermore, the external CPU 50 reads data through the address pin 35 and the I/O pin 34 from Bank0 of the flash memory array 11 in which a block erase operation is not being executed.

In this way, the block erase operation in Bank1 by the write state machine WSM, the access operation to the SRAM array by the external CPU 50, and the read operation from Bank0 can be executed in a parallel manner.

Embodiment 3

Figure 30:
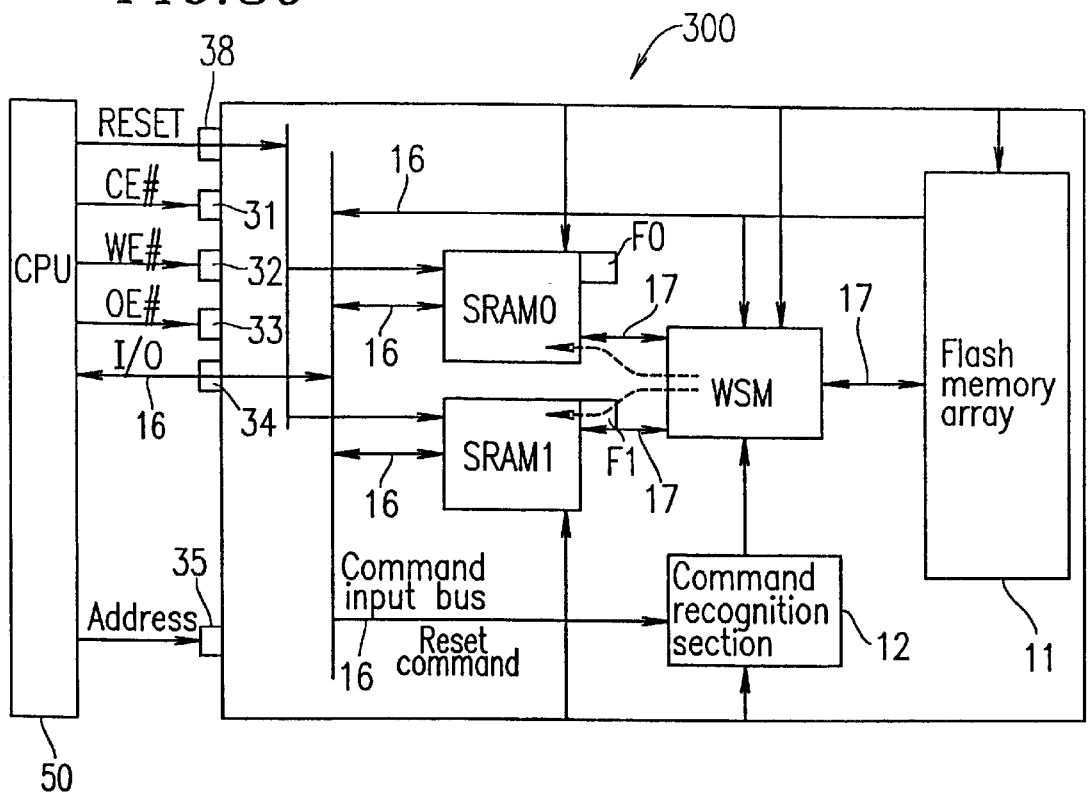
FIG. 30 shows a structure of a semiconductor storage device 300 according to embodiment 3 of the present invention.

FIG. 30 shows a structure of a semiconductor storage device 300 according to embodiment 3 of the present invention. In the semiconductor storage device 300, each of SRAM0 and SRAM1 can be reset to a predetermined state by a reset enable signal which is input to the semiconductor storage device 300 through a RESET pin 38.

Figure 3:
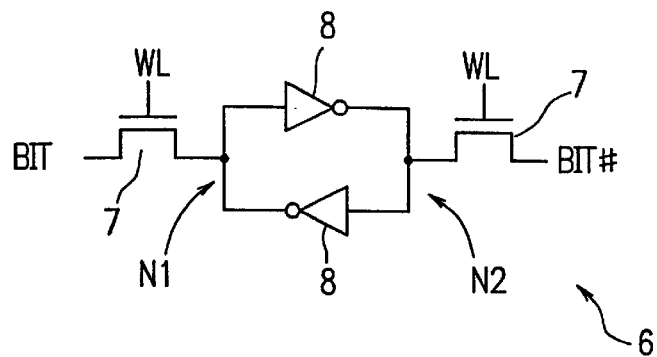
FIG. 3 shows a structure of a memory cell of a SRAM which is a volatile semiconductor storage device.
Figure 31:
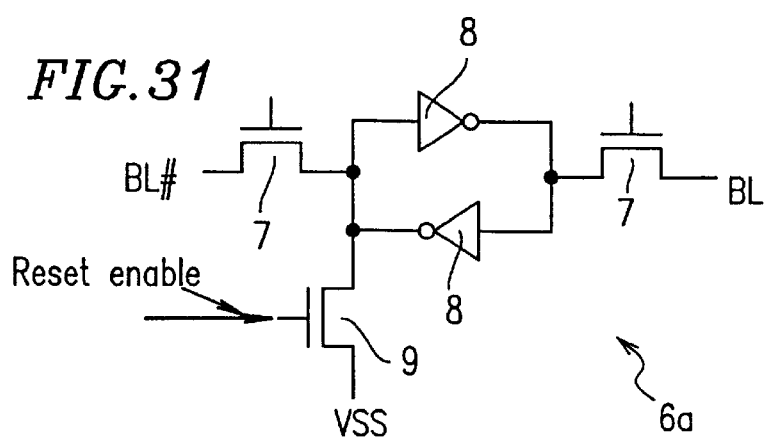
FIG. 31 shows a structure of an SRAM memory cell 6a used in SRAM0 and SRAM1 of the semiconductor storage device 300.

FIG. 31 shows a structure of an SRAM memory cell 6a used in SRAM0 and SRAM1 of the semiconductor storage device 300. The SRAM memory cell 6a is different from the SRAM memory cell 6 shown in FIG. 3 in that the SRAM memory cell 6a includes a reset transistor 9 at a node between one of switch transistors 7 and a pair of inverters 8. A control gate of the reset transistor 9 functions as a reset enable node to which a reset enable signal RESET is input. When the reset enable node is at a high level "H", the SRAM memory cell 6a is reset to a predetermined state.

Reset terminals of all of the SRAM memory cells 6a used in SRAM0 and SRAM1 are connected together to a RESET pin 38 of the semiconductor storage device 300 as shown in FIG. 30. In a normal state, the RESET pin 38 is at a low level "L". A reset enable signal of a high level con reset SRAM0 and SRAM1 altogether to a predetermined state. When the RESET pin 38 goes to a low level "L", SRAM0 and SRAM1 are released from the reset state (i.e., the predetermined state).

In the semiconductor storage device 300 having such a structure, by setting the reset enable node to a high level "H", contents of SRAM0 and SRAM1 can be reset to a predetermined state. Thus, the contents of SRAM0 and SRAM1 can be reset altogether.

The semiconductor storage device 300 is not limited to a structure where SRAM0 and SRAM1 are reset together by a reset enable signal which is input through the RESET pin 38. According to the present invention, the write state machine WSM may reset SRAM0 and SRAM1 together according to a predetermined reset command supplied by the external CPU 50.

Alternatively, each SRAM memory cell may be reset separately. Specifically, in response to a predetermined reset command supplied by the external CPU 50, data content stored in a particular SRAM memory cell which is designated by the reset command is transferred to another memory cell, and the designated SRAM memory cell is reset. In this cases all data stored in the SRAM memory cells 6a within a particular area of SRAM0 and SRAM1 can be reset to a predetermined data.

In the semiconductor storage device 300 having such a reset function, an overwrite over data stored in the flash memory array 11 can be prevented. In the flash memory array 11, an overwrite over data stored in a particular address is possible. However, after data has been written in the flash memory array 11, the data la erased on a block by block basis. Thus, once data is erroneously overwritten in a cell of the flash memory array 11, it is difficult to correct such an error.

Figure 32:
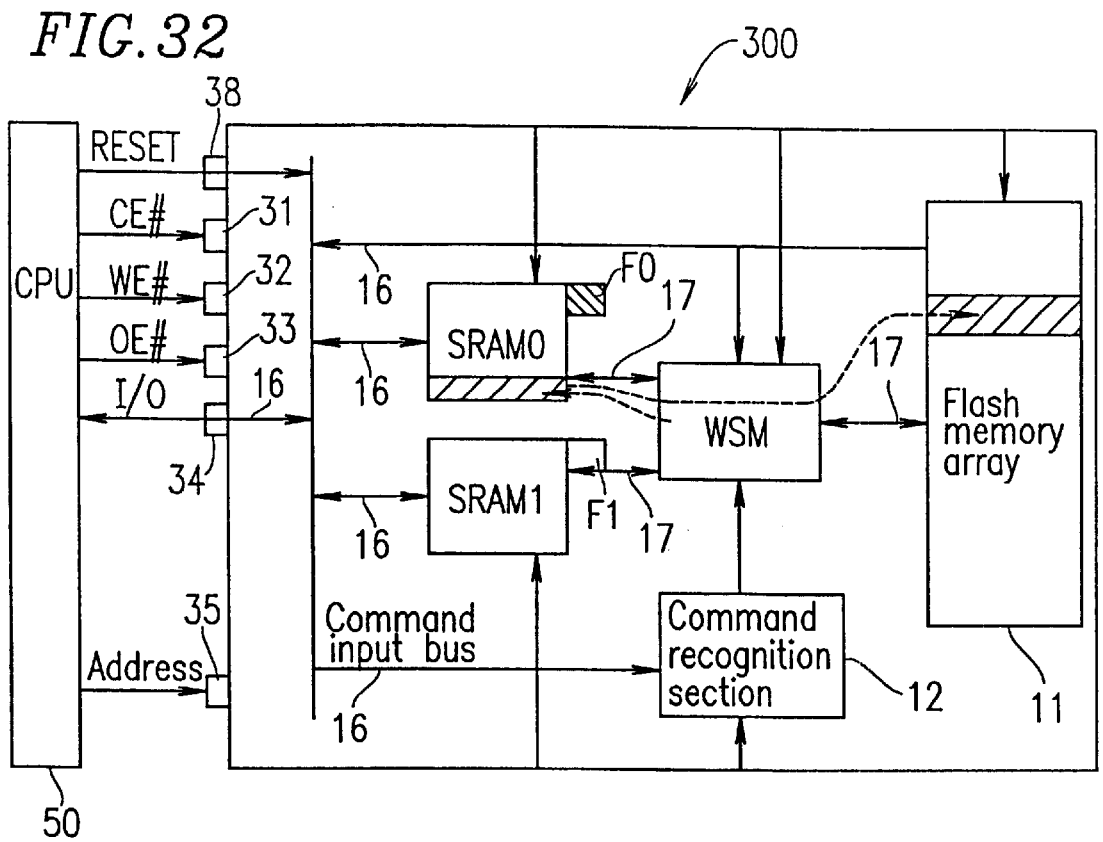
FIG. 32 shows an exemplary flow of data in the semiconductor storage device 300.

Referring to FIG. 32, in the semiconductor storage device 300 having the above reset function, after data is transferred from a particular region in SRAM0 (with slanted lines) to the flash memory array 11, the particular region may be reset by the write state machine WSM. In this case, If a reset memory cell (i.e., erased memory cell) of the flash memory array 11 has a value of "0", it is preferable that the particular region be reset so that each of memory cells in the particular region has a value of "0". With such an arrangement, after SRAM0 has been reset, even if the particular region in SRAM0 is designated in a data transfer command as a data transfer origin, data in the particular region cannot be written over data in the flash memory array 11 because the value of the memory cells in the particular region is "0". Therefore, there is no possibility that a data transfer from SRAM0 to the flash memory array 11 causes an overwrite of data in the flash memory array 11

Embodiment 4

Figure 33:
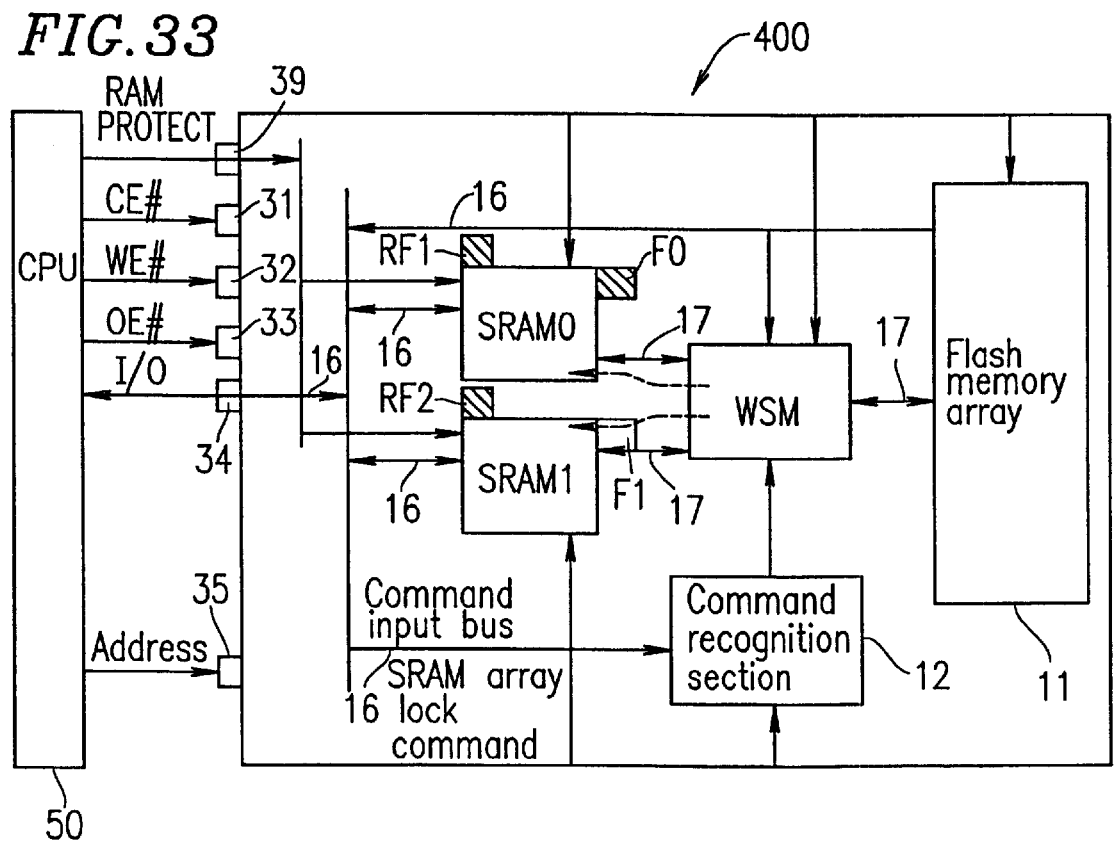
FIG. 33 shows a structure of a semiconductor storage device 400 according to embodiment 4 of the present invention.

FIG. 33 shows a structure of a semiconductor storage device 400 according to embodiment 4 of the present invention. The semiconductor storage device 400 includes a RAMPROTECT pin 39 for achieving a data overwrite protect operation in each of SRAM0 and SRAM1. When the RAMPROTECT pin 39 is at a high level "H", data in SRAM0 or SRAM1 a protected from an overwrite access. Specifically, when the RAMPROTECT pin 39 is at a high level "H", the semiconductor storage device 400 provides a lock bit to SRAM0 or SRAM1 so as to thrust a data write control circuit of SRAM0 or SRAM1 into an inactive state, whereby writing of data in SRAM0 and SRAM1 cannot be executed. Furthermore, when SRAM0 and SRAM1 are in the overwrite protection state, lock flags RP1 and RP2 are set on SRAM0 and SRAM1, respectively. With the lock flags RF1 and RP2, the external CPU 50 can recognize that SRAM0 and SRAM1 are in the overwrite protection state.

The look bit is given to each of SRAM0 and SRAM1 so that the data write control circuits of SRAM0 and SRAM1 can be separately thrust into an inactive state. Thus, an overwrite of data can be prevented for each of SRAM0 and SRAM1.

Embodiment 5

Figure 34:
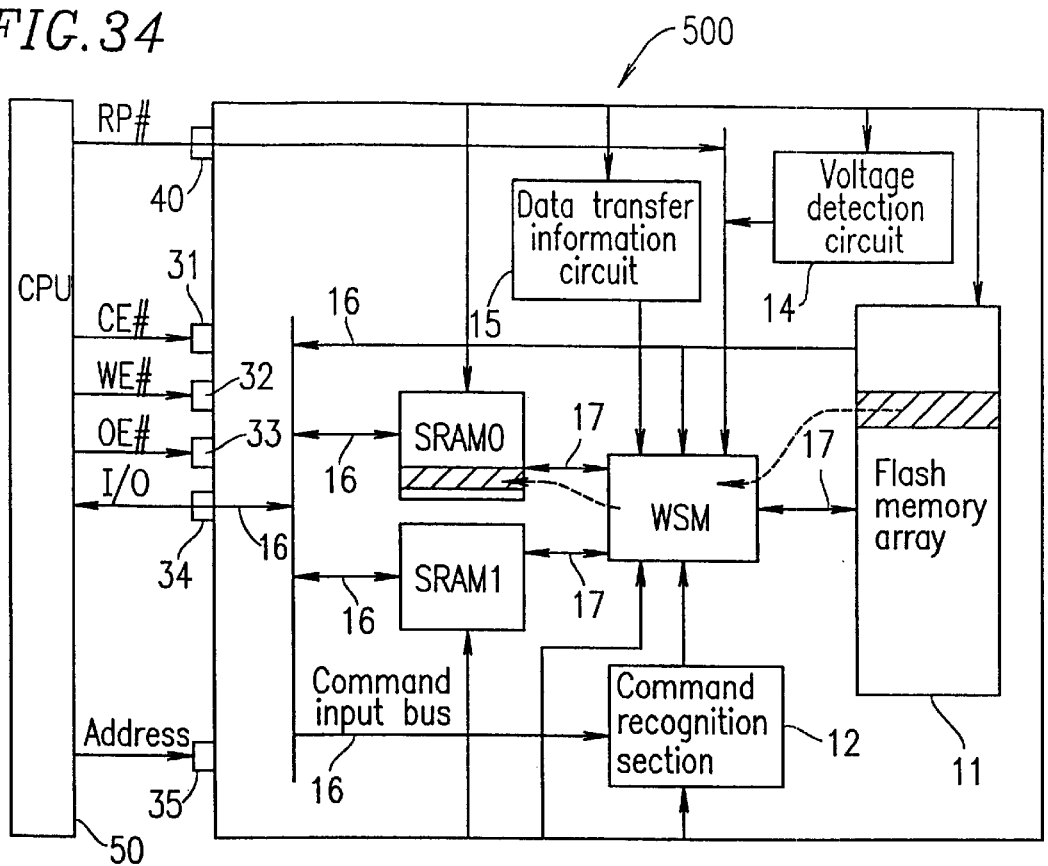
FIG. 34 shows a structure of a semiconductor storage device 500 according to embodiment 5 of the present invention.

FIG. 34 shows a structure 6f a semiconductor storage device 500 according to embodiment 5 of the present invention. The semiconductor storage device 500 has a power-down function: when an RP# signal is pulled to a low level, the state of a control circuit is initialized and the semiconductor storage device 500 is thrust into a sleep state, whereby a power consumption by the semiconductor storage device 500 is reduced. In the semiconductor storage device 500, when a predetermined supply voltage is applied to the semiconductor storage device 500 (power-on) or when the semiconductor storage device 500 is returned from the power-down state to an active state by pulling the RP# signal to a high level, data stored in a predetermined area within the flash memory array 11 is automatically transferred to SRAM0 or SRAM1. In order to achieve this function, the semiconductor storage device 500 includes a voltage detector circuit 14, an RP# pin 40 for receiving a command for a power-down operation (RP# signal), and a data transfer information circuit 15 for storing data transfer information about a data transfer from the flash memory array 11 to SRAM0 and SRAM1.

The data transfer information circuit 15 stores a transfer origin start address and a transfer origin end address in the flash memory array 11 and a transfer destination start address in SRAM0 which are designated for the data transfer from the flash memory array 11 to SRAM0 which is executed at power-on or when the semiconductor storage device 500 returns from the power-down state to a normal active state.

In the semiconductor storage device 500, when the voltage detector circuit 14 detects that a power to the semiconductor storage device 500 is turned on or detects according to a variation of the RP# signal that the semiconductor storage device 500 is returned from the power-down state, the write state machine WSM reads from the data transfer information circuit 15 the transfer origin start address and the transfer origin end address in the flash memory array 11 and the transfer destination start address in SRAM0 and execute a data transfer from the flash memory array 11 to SRAM0 based on the read addresses. In this way, data stored in the flash memory array 11 can be transferred to SRAM0.

Thus, since particular data stored in the flash memory array 11 is downloaded (transferred) to SRAM0 when a power to the semiconductor storage device 500 is turned on or when the semiconductor storage device 300 returns from the power-down state to a normal active state, the external CPU 50 can use the particular data immediately after powering-on or returning from the power-down state. Such a structure is useful especially when a program is downloaded from the flash memory array 11 to the SRAM array before the external CPU 50 reads the program out of the semiconductor storage device 500.

Figure 35:
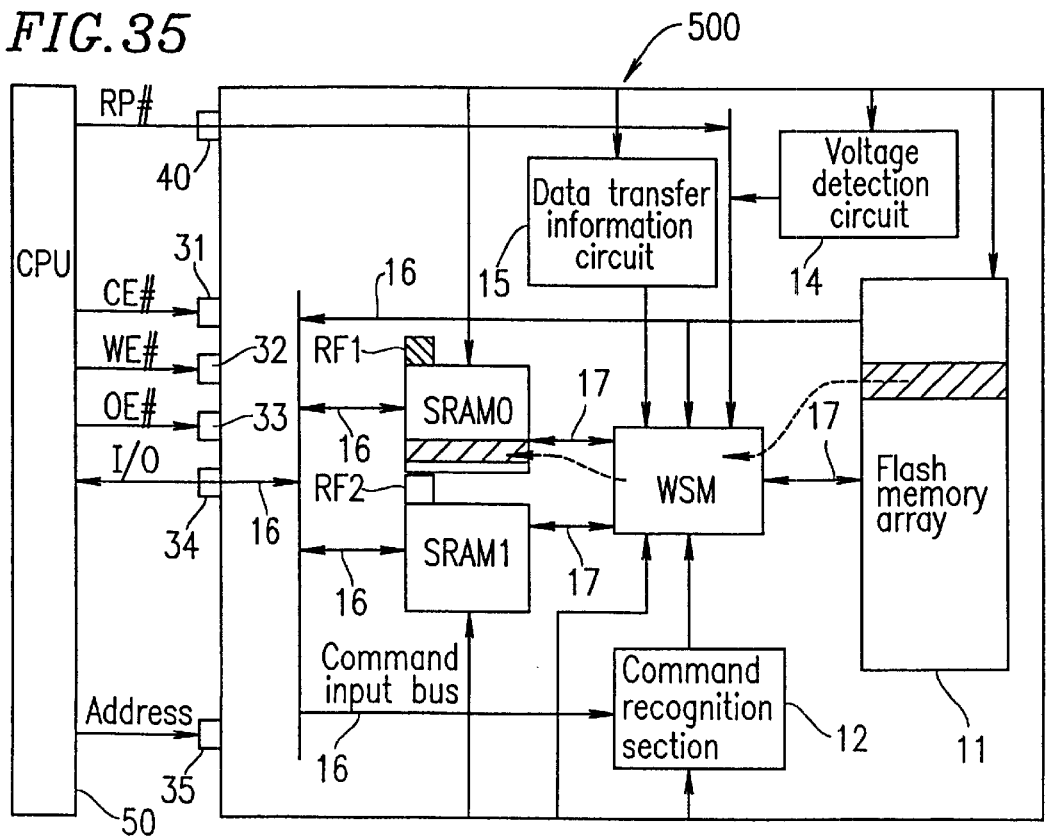
FIG. 35 shows an exemplary flow of data in the semiconductor storage device 500.

In the semiconductor storage device 500, after data is transferred to the SRAM array, the transferred data may be protected from an overwrite access. In this case, as shown in FIG. 35, lock flags RF1 and RF2 are provided to SRAM0 and SRAM1, respectively, for preventing an overwrite of data in SRAM0 and SRAM1.

In the semiconductor storage device 500, for example, when data is transferred from the flash memory array 11 to SRAM0, the write state machine WSM sets the lock flag RF1 so as to protect SRAM0 from an overwrite access, whereby the data transferred to SRAM0 cannot be replaced with another data. Thus, when a program is downloaded from the flash memory array 11 to the SRAM array before the external CPU 50 reads the program out of the semiconductor storage device 500, there is no possibility that the downloaded program is replaced with another data.

Figure 36:
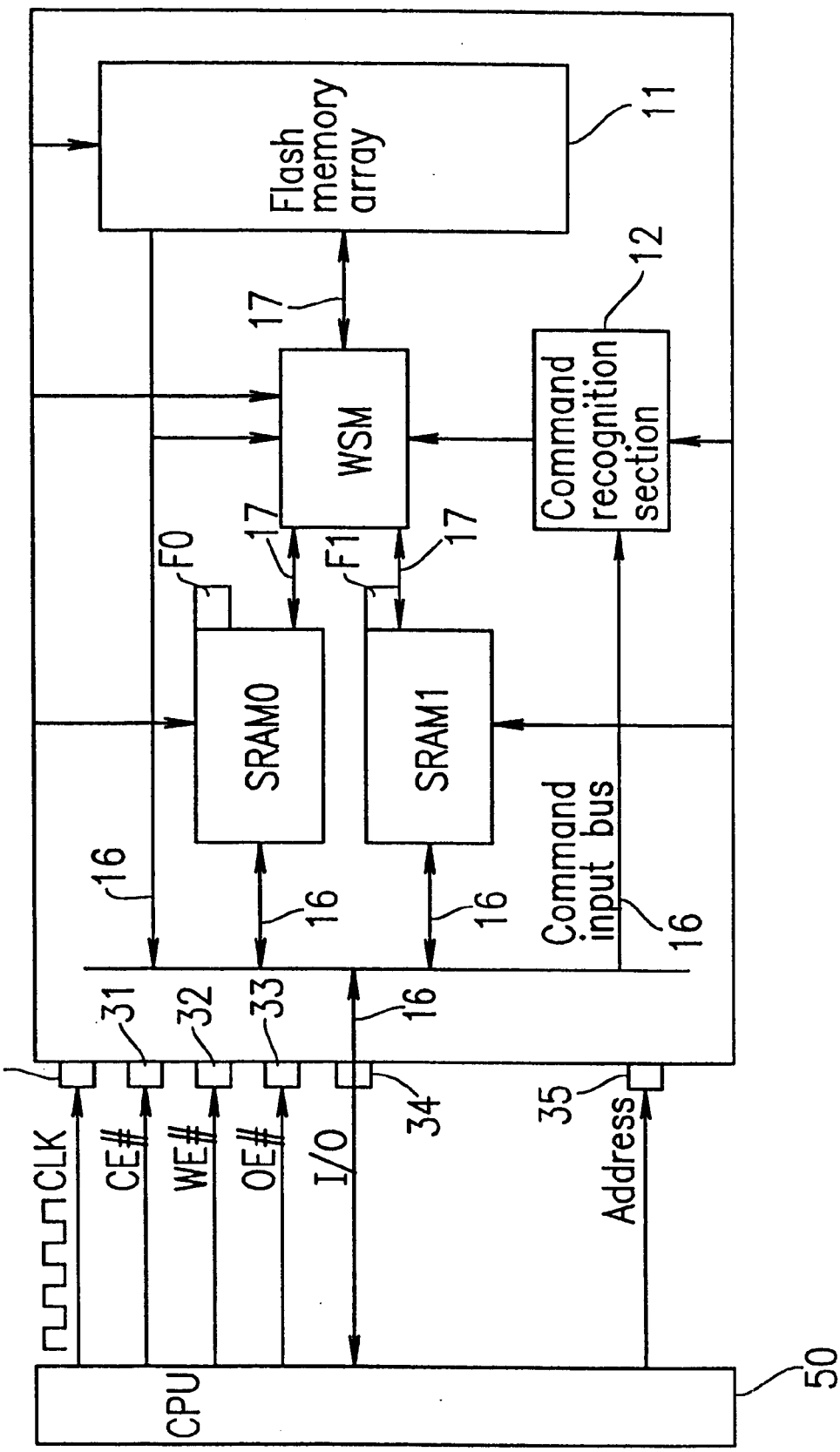
FIG. 36 shows a structure of a semiconductor storage device 600 according to the present invention.

Except for the above features, the semiconductor storage device 500 has the same structure as that of the semiconductor storage device 300 shown in FIG. 32, According to the present invention, data may be input to/output from a semiconductor storage device in synchronization with a clock signal. A semiconductor storage device 600 shown in FIG. 36 Includes a CLK pin 41 for receiving a clock signal CLK. In the semiconductor storage device 600, data is input/output through the I/O pin 34 in synchronization with the clock signal CLK, whereby a synchronous interface is achieved Such a structure realizes reading/writing of data in a synchronous manner at a higher rate as compared with a normal data reading/writing rate.

Figure 37A:
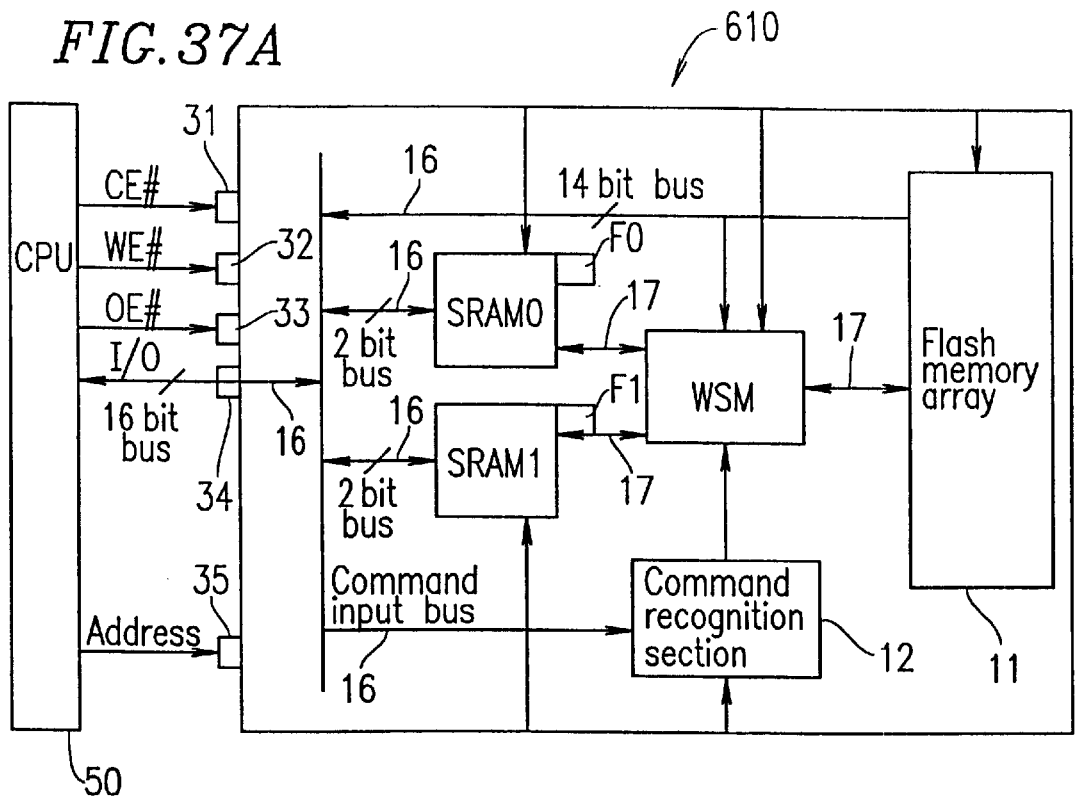
FIG. 37A shows a structure of a semiconductor storage device 610 according to the present invention.
Figure 37B:
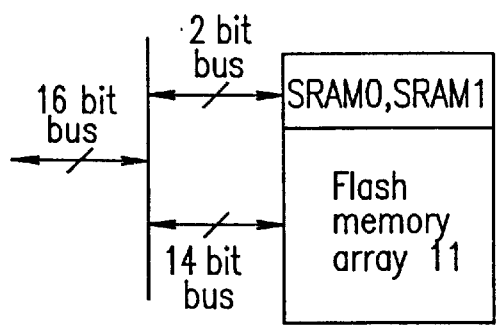
FIGS. 37B and 37C shows structures of exemplary memory maps.

According to the present invention, as shown in a semiconductor storage device 610 of FIG. 37A, a data bus having a 16 bit-width may be used as the input/output data bus 16 where 14 bits are used for reading data from the flash memory array 11 and 2 bits are used for reading data from SRAM0 and SRAM1. Alternatively, referring to FIG. 37B, a 16-bit memory map where a decoder circuit allocates 14 bits for the flash memory array 11 and 2 bits for SRAM0 and SRAM1 is within the scope of the present invention. With these structures shown in FIGS. 37A and 37B, the external CPU 50 can read all of 14-bit data in the flash memory array 11 and 2-bit data in SRAM0 and SRAM1 during a single read operation.

Furthermore, when a common write command is used for SRAM0 and SRAM1 and the flash memory array 11, data can be written in SRAM0 and SRAM1 and the flash memory array 11 at the same time.

Thus, since reading/writing of data from/in SRAM0 and SRAM1 and the flash memory array 11 can be simultaneously executed, the semiconductor storage device 610 can readily establish compatibility with a system including the external CPU 50.

Figure 37C:
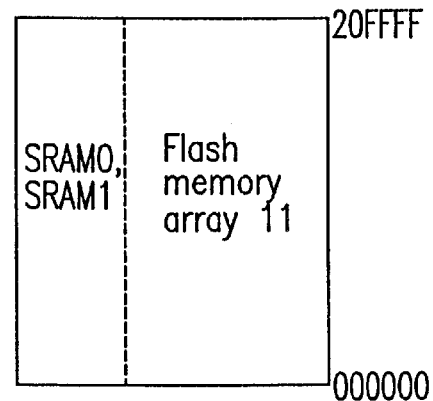

It should be noted that in the 16-bit memory map, the upper two bits may be allocated to SRAM0 and SRAM1, and the lower fourteen bits may be allocated to the flash memory array 11 as shown in FIG. 37C.

Figure 38:
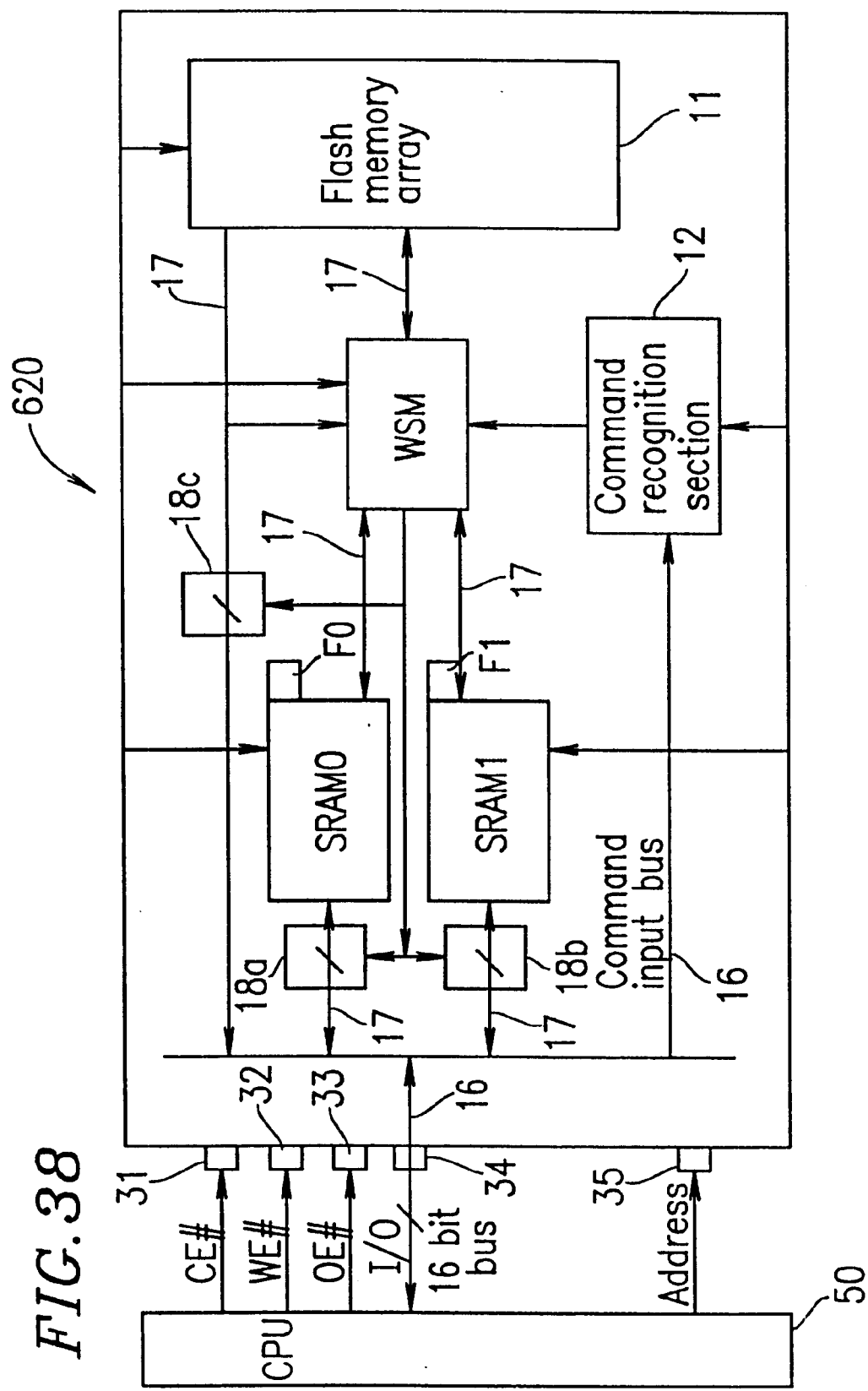
FIG. 38 shows a structure of a semiconductor storage device 620 according to the present invention.

According to the present invention, a semiconductor storage device may be structured as shown in FIG. 38. In a semiconductor storage device 620 of FIG. 38, the input/ output data bus 16 has a 16 bit-width, bus-width switches 18a and 18b are provided to the internal transfer data buses 17 connected to SRAM0 and SRAM1, respectively, and a bus-width switch 18c is provided to the internal transfer data bus 17 connected to the flash memory array 11. With these switches 18a–18c, the bus widths allocated to SRAM0, SRAM1, and the flash memory array 11 are determined at an appropriate ratio according to which of SRAM0, SRAM1, and the flash memory array 11 uses the input/output data bus 16. For example, allocation of bus width to SRAM0, SRAM1, and the flash memory array 11 is switched between a case where one of at least one of SRAM0 and SRAM1 and the flash memory array 11 uses the input/output data bus 16 and a case where both of at least one of SRAM0 and SRAM1 and the flash memory array 11 uses the input /output data bus 16. The switches 18a–18c are switched by predetermined signals or by predetermined commands.

Thus, in the semiconductor storage device 620 having such a structure, reading/writing of data from/in SRAM0 and SRAM1 and the flash memory array 11 can be simultaneously executed. Therefore, the semiconductor storage device 620 can readily establish compatibility with a system including the external CPU 50.

Figure 39A:
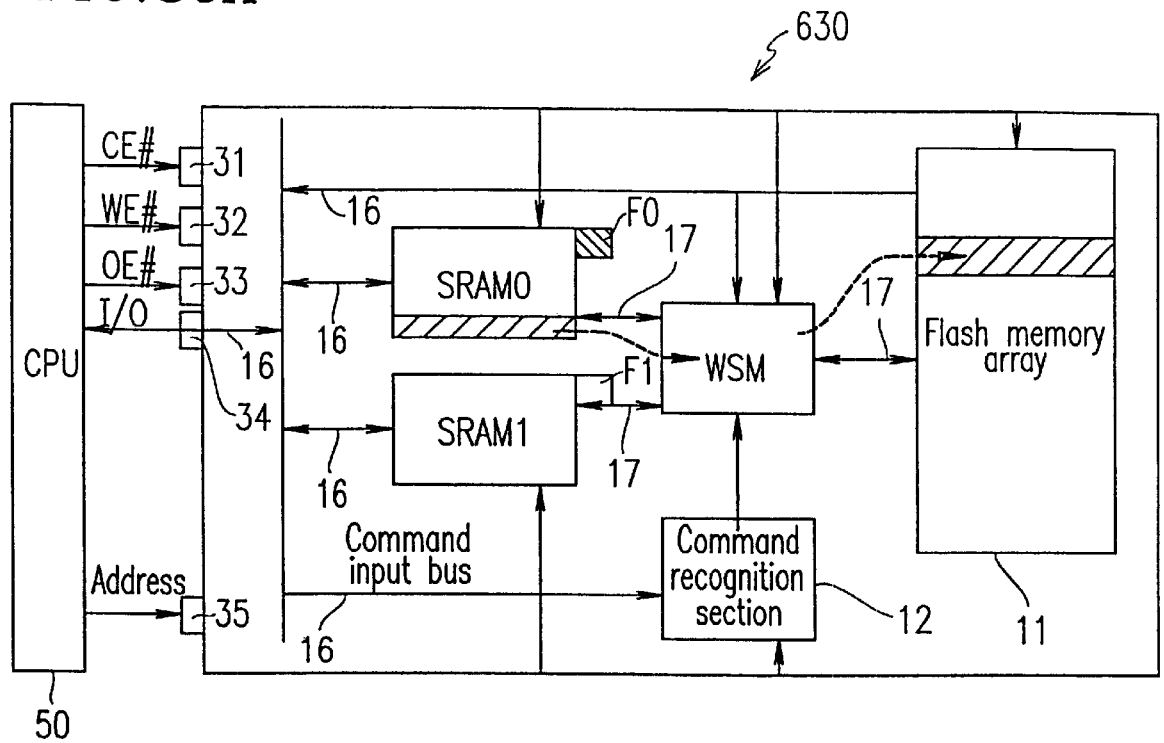
FIG. 39A shows a structure of a semiconductor storage device 630 according to the present invention.
Figure 39B:
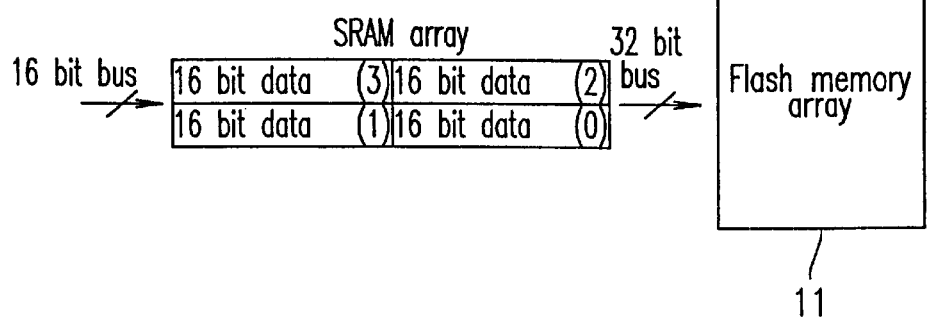
FIGS. 39B and 39C show examples of a data transfer in the semiconductor storage device 630.

Furthermore, the internal transfer data bus 17 may have a greater bus width than that of the input/output data bus 16. For example, in a semiconductor storage device 630 of FIG. 39A, the input/output data bus 16 has a 16 bit-width, and the internal transfer data bus 17 has a 32 bit-width. In such a structure, for example, when four 16-bit data sets in the SRAM array are transferred to the flash memory array 11 through the internal transfer data bus 17 having a 32 bit-width as shown in FIG. 39B, a data program operation of 32 bits in the flash memory array 11 is executed twice.

Figure 39C:
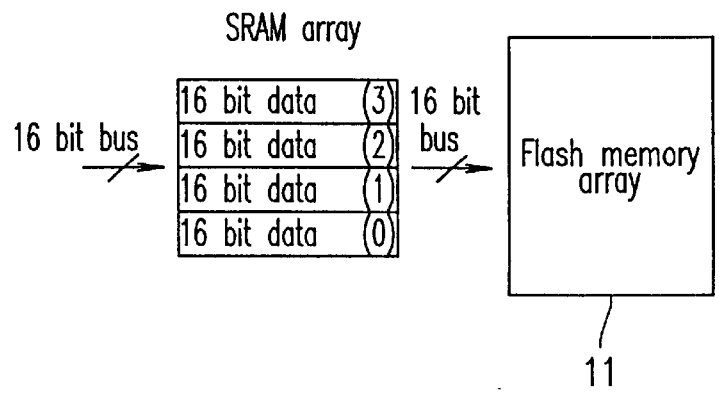

Alternatively, as shown in FIG. 39C, when the internal transfer data-bus 17 has a 16 bit-width, when four 16-bit data sets in the SRAM array are transferred to the flash memory array 11, a data program operation of 16 bits in the flash memory array it must be executed four times.

Thus, when the internal transfer data bus 17 has a greater bus width than that of the input/output data bus 16, reading of data from the SRAM array by the write state machine WSM and writing of data in the flash memory array 11 by the write state machine WSM can be executed at a high rate.

A semiconductor storage device according to the present invention does not require an SRAM externally attached thereto. Furthermore, in the semiconductor storage device according to the present invention, the memory capacity of the SRAM array can be reduced. As described above, in general, the time required for reading data from the SRAM, about 100 ns, is substantially the same as that required for reading data from the flash memory. However, the time required for writing data in the flash memory is considerably longer as compared with writing of data in the SRAM array in the semiconductor storage device according to the present invention, the time required for writing data in the flash memory is reduced in appearance. Furthermore, according to the present invention, the flash memory can store date which would be stored in the SRAM in a conventional storage device, whereby the capacity of the SRAM can be reduced. As a result, the entire chip area of the semiconductor storage device can be reduced.

In general, the flash memory stores 1-bit data using one transistor, while the SRAM array stores 1-bit data using six transistors. Thus, when data is stored in the flash memory in place of the SRAM array, the entire chip area of the semiconductor storage device can be reduced.

Furthermore, in a semiconductor storage device according to the present invention, during a data transfer from an SRAM array to a flash memory, an external CPU can write data in another SRAM array. In such a structure, while data is being written in an SRAM array at a high rate, a data transfer from another SRAM array to the flash memory can be executed, whereby the rate of writing data into the flash memory can be increased in appearance.

Figure 40:
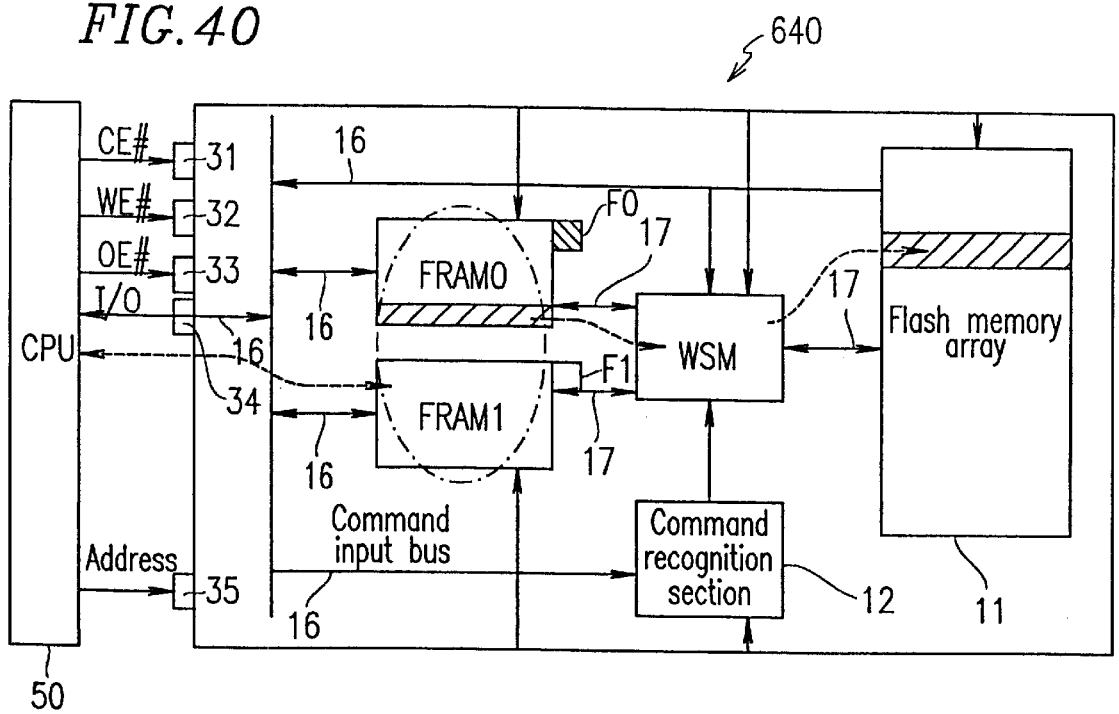
FIG. 40 shows a structure of a semiconductor storage device 640 according to the present invention.

Furthermore, according to the present invention, a pair of FRAM arrays, in which an overwrite of data can be executed at a high rate, can be used in place of a pair of SRAM arrays as shown in a semiconductor storage device 640 of FIG. 40. In this case also, as shown in FIG. 40, data can be transferred between the write state machine WSM and the FRAM arrays, FRAM0 and FRAM1. Note that two or more FRAM arrays may be provided.

In the semiconductor storage device 640, an overwrite of data can be executed at a high rate in a FRAM array as in an SRAM array. Furthermore, a cell area of a FRAM cell included in the FRAM array is smaller than that of an SRAM cell included in the SRAM array. Thus, the entire chip area can be reduced.

Thus, in a semiconductor storage device according to the present invention, data is temporarily stored in a first memory array formed by a volatile semiconductor storage device which requires a short time for writing data therein, such as an SRAM, or formed by a non-volatile semiconductor storage device which enables a high-rate operation, and then, the temporarily-stored data is is transferred en bloc to a second memory array formed by a non-volatile semiconductor storage device, such as a flash memory, etc. With such an arrangement, an external device, such as a CPU or the like, does not experience a standby time during the data transfer to the semiconductor memory array, and therefore can deal with other operations.

Furthermore, a plurality of first memory arrays may be provided. In such a structure, during a data transfer from a first memory array to the second memory array, data can be written in another first memory array. Thus, a larger amount of data can be written in the first memory array in a shorter period of time. Moreover, during a data erasure from the second memory array, data can be written in the first memory array. Still further, during a data transfer from one first memory array, data stored in another memory array can be read out to an external device, i.e., another memory array is available to the external device during the data transfer from the one first memory array.

Furthermore, data from an external device is temporarily stored in a first memory array, and the temporarily-stored data is transferred to a second memory array and stored therein. Thus, it is not necessary to provide an external SRAM for temporarily storing data. As a result, the entire chip area can be reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor storage device, comprising:
   a plurality of first memory arrays each including a plurality of semiconductor storage elements, in which data from an external device is written through an input/output data bus, and from which data is read out to the external device through the input/output data bus;

a second memory array which operates separately from the plurality of first memory arrays and in which data from an external device is written through the input/output data bus, and from which data is read out to the external device through the input/output data bus and which includes at least one block including a plurality of non-volatile semiconductor storage elements; and a data transfer section for transferring the data between the plurality of first memory arrays and the second memory array through a control circuit of a write state machine.

2. A semiconductor storage device according to claim 1, wherein the plurality of first memory arrays, the second memory array, and the data transfer section are formed on a same chip.

3. A semiconductor storage device according to claim 1, wherein the plurality of semiconductor storage elements included in the first memory array are non-volatile semiconductor storage elements.

4. A semiconductor storage device according to claim 1, wherein the plurality of semiconductor storage elements included in the first memory array are volatile semiconductor storage elements.

5. A semiconductor storage device according to claim 1, wherein during a transfer of the data between at least one of the plurality of first memory arrays and the second memory array, an external device externally attached to the semiconductor storage device reads first data from or writes first data in the plurality of first memory arrays.

6. A semiconductor storage device according to claim 1, wherein during a transfer of the data between at least one of the plurality of first memory arrays and the second memory array, an external device externally attached to the semiconductor storage device reads first data from, writes first data in, or erases first data from the second memory array.

7. A semiconductor storage device according to claim 1, wherein a command to access the second memory array includes a command to access the plurality of first memory arrays.

8. A semiconductor storage device according to claim 1, wherein the data transfer section transfers the data stored in a first address in the plurality of first memory arrays to a second address in the second memory array.

9. A semiconductor storage device according to claim 1, wherein the data transfer section transfers the data stored in a second address in the second memory array to a first address in the plurality of first memory arrays.

10. A semiconductor storage device according to claim 1, wherein the date transfer section transfers the data stored in a first region in the plurality of first memory arrays to a second region in the second memory array.

11. A semiconductor storage device according to claim 1, wherein the data transfer section transfers the data stored in a second region in the second memory array to a first region in the plurality of first memory arrays.

12. A semiconductor storage device according to claim 1, wherein the data transfer section transfers all of the data stored in at least one of the plurality of first memory arrays to a particular region in the second memory array.

13. A semiconductor storage device according to claim 1, wherein the data transfer section transfers an amount of the data which is equal to the capacity of at least one of the plurality of first memory arrays to the at least one of the plurality of first memory arrays from the second memory array.

14. A semiconductor storage device according to claim 1, wherein:

before a transfer of the data between the plurality of first memory arrays and the second memory array, the data transfer section compares the data stored in a transfer origin address and first data stored in a transfer destination address;

when the data stored in the transfer origin address is identical to the first data stored in the transfer destination address, the data transfer section does not transfer the data; and when otherwise, the data transfer section transfers the data from the transfer origin address to the transfer destination address.

15. A semiconductor storage device according to claim 5, wherein the external device accesses the plurality of first memory arrays except for the at least one of the plurality of first memory arrays during the transfer of the data between the at least one of the plurality of first memory arrays and the second memory array.

16. A semiconductor storage device according to claim 5, wherein an access by the external device to the at least one of the plurality of first memory arrays is prohibited during the transfer of the data between the at least one of the plurality of first memory arrays and the second memory array.

17. A semiconductor storage device according to claim 5, wherein:

a transfer of the data between the at least one of the plurality of first memory arrays and the second memory array is interrupted by an access by the external device: and the transfer of the data between the at least one of the plurality of first memory arrays and the second memory array in resumed after the access by the external device has been completed.

18. A semiconductor storage device according to claim 1, wherein, while the data is being erased from a particular block in the second memory array, the plurality of first memory arrays are accessed by the external device.

19. A semiconductor storage device according to claim 1, wherein, while the data is being written in a particular block in the second memory array, the plurality of first memory arrays are accessed by the external device.

20. A semiconductor storage device according to claim 1, wherein a capacity of the at least one of the plurality of the first memory arrays is equal to, multiple of, or divisional of a capacity of a block in the second memory array which can be erased en bloc.

21. A semiconductor storage device according to claim 1, wherein:

the plurality of first memory arrays and the second memory array exist in different memory spaces; and an access to the plurality of first memory arrays and an access to the second memory array are achieved by a single control terminal.

22. A semiconductor storage device according to claim 1, wherein:

the plurality of first memory arrays and the second memory array exist in a same memory space; and an access to the plurality of first memory arrays and an access to the second memory array are achieved by different control terminals.

23. A semiconductor storage device according to claim 1, wherein an access mode is switched between a first access mode where an access to the plurality of first memory arrays and an access to the second memory array are achieved by a single control terminal and a second access mode where the access to the plurality of first memory arrays and the access to the second memory array are achieved by two or more control terminals.

24. A semiconductor storage device according to claim 1, wherein:
the second memory array includes a plurality of banks, in each of which an erase operation and a program operation of the data and a read operation of the data can be executed separately from other banks; and
the data is transferred between the plurality of banks and the plurality of first memory arrays through the data transfer section.

25. A semiconductor storage device according to claim 24, wherein during a transfer of the data between the plurality of banks and the plurality of first memory arrays, the external device executes one of reading of first data from the plurality of first memory arrays, writing of second data in the plurality of first memory arrays, and reading of third data from at least one of the plurality of banks which is not used for the transfer of the data.

26. A semiconductor storage device according to claim 24, wherein, while the data is being erased from one of the plurality of banks, the external device executes one of reading of first data from the plurality of first memory arrays, writing of second data in the plurality of first memory arrays, and reading of third data from at least one of the plurality of banks in which the erasure of the data is not executed.

27. A semiconductor storage device according to claim 24, wherein, while the data is being written in one of the plurality of banks, the external device executes one of reading of first data from the plurality of first memory arrays, writing of second data in the plurality of first memory arrays, and reading of third data from at least one of the plurality of banks in which the writing of the data is not executed.

28. A semiconductor storage device according to claim 1, wherein all of the data written in at least one of the plurality of first memory arrays is reset to a predetermined state.

29. A semiconductor storage device according to claim 28, wherein the at least one of the plurality of first memory arrays is reset to a value of a reset cell of the second memory array.

30. A semiconductor storage device according to claim 28, wherein, after the data written in at least one of the plurality of first memory arrays is transferred to the second memory array, the at least one of the plurality of first memory arrays to reset.

31. A semiconductor storage device according to claim 1, wherein the data in at least one of the plurality of first memory arrays is protected from an overwrite.

32. A semiconductor storage device according to claim 1, wherein the data transfer section transfers the data in a first region in the second memory array to a second region in the plurality of first memory arrays when a power to the semiconductor storage device is turned on or when the semiconductor storage device returns from a power-down state to a normal active state.

33. A semiconductor storage device according to claim 32, wherein, after the data is transferred from the second memory array to the plurality of first memory arrays, the transferred data in the plurality of first memory arrays are protected from an overwrite.

34. A semiconductor storage device according to claim 1, wherein an access by the external device to the plurality of first memory arrays and an access by the external device to the second memory array are performed in synchronization with a clock signal.

35. A semiconductor storage device according to claim 1, wherein a transfer status of the data between the plurality of first memory arrays and the second memory array is output to the external device.

36. A semiconductor storage device according to claim 1, further including an input/output data bus which has a predetermined bus widths wherein allocation of bus width to the plurality of first memory arrays and the second memory array is switched between a case where one of at least one of the plurality of first memory arrays and the second memory array uses the input/output data bus and a case where both of at least one of the plurality of first memory arrays and the second memory array use the input/output data bus.

37. A semiconductor storage device according to claim 36, wherein the allocation of the predetermined bus widths to the plurality of first memory arrays and the second memory array is controlled by one of a control terminal connected to the external device and a predetermined command.

38. A semiconductor storage device according to claim 1, further including:
an input/output data bus which is used for a transfer of the data between the external device and the plurality of first memory arrays and the second memory array; and
an internal data bus which is used for a transfer of the data between the plurality of first memory arrays and the second memory array,
wherein a bus width of the internal data bus is greater than that of the input/output data bus.

* * * * *